(12) United States Patent  (10) Patent No.: US 7,902,584 B2
Nakajima  (45) Date of Patent: Mar. 8, 2011

(54) SEMICONDUCTOR MEMORY DEVICE AND MANUFACTURING METHOD THEREOF

(75) Inventor: Hiroomi Nakajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 357 days.

(21) Appl. No.: 12/100,619

(22) Filed: Apr. 10, 2008

(65) Prior Publication Data

US 2008/0251843 A1  Oct. 16, 2008

(30) Foreign Application Priority Data

Apr. 16, 2007 (JP) ................................. 2007-107347
Mar. 31, 2008 (JP) ................................. 2008-090627

(51) Int. Cl.
*H01L 27/108* (2006.01)
(52) U.S. Cl. ......... 257/308; 257/296; 257/317; 257/330; 257/E27.089
(58) Field of Classification Search .................. 257/296, 257/308, 317, 330
See application file for complete search history.

(56) References Cited

U.S. PATENT DOCUMENTS

| 4,996,574 | A | 2/1991 | Shirasaki | |
|---|---|---|---|---|
| 2007/0034925 | A1* | 2/2007 | Lee et al. | 257/296 |
| 2008/0149984 | A1* | 6/2008 | Chang et al. | 257/314 |
| 2008/0150075 | A1* | 6/2008 | Chang | 257/506 |

FOREIGN PATENT DOCUMENTS

JP  2006-100600  4/2006

OTHER PUBLICATIONS

Takashi Ohsawa, et al., "Memory Design Using a One-Transistor Gain Cell on SOI", IEEE Journal of Solid-State Circuits, vol. 37, No. 11, Nov. 2002, pp. 1510-1522.

* cited by examiner

*Primary Examiner* — Wai-Sing Louie
(74) *Attorney, Agent, or Firm* — Oblon, Spivak, McClelland, Maier & Neustadt, L.L.P.

(57) ABSTRACT

This disclosure concerns a semiconductor memory device including a substrate; an insulating film provided above the substrate; a semiconductor layer provided above the insulating film and extending in a plane which is parallel to a surface of the substrate; a first gate dielectric film provided on an inner wall of a opening penetrating through the semiconductor layer; a first gate electrode penetrating through the opening and isolated from the semiconductor layer by the first gate dielectric film; a second gate dielectric film formed on a side surface and an upper surface of the semiconductor layer located on the first gate electrode; and a second gate electrode provided on the side surface and the upper surface of the semiconductor layer via the second gate dielectric film, isolated from the first gate electrode, and superimposed on the first gate electrode.

7 Claims, 39 Drawing Sheets

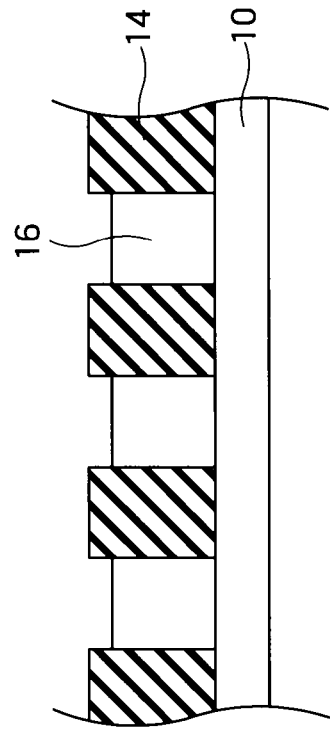
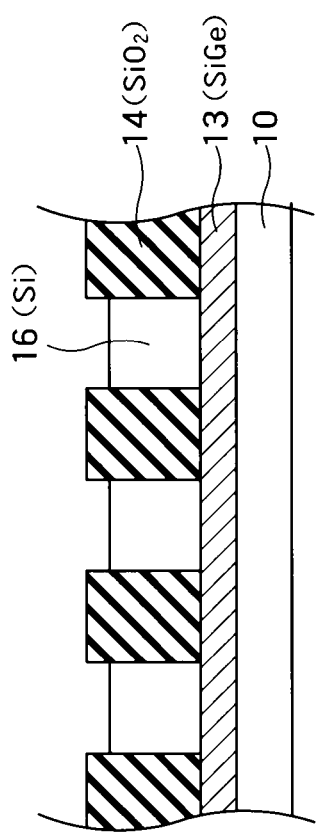
FIG. 12A
FIG. 12B

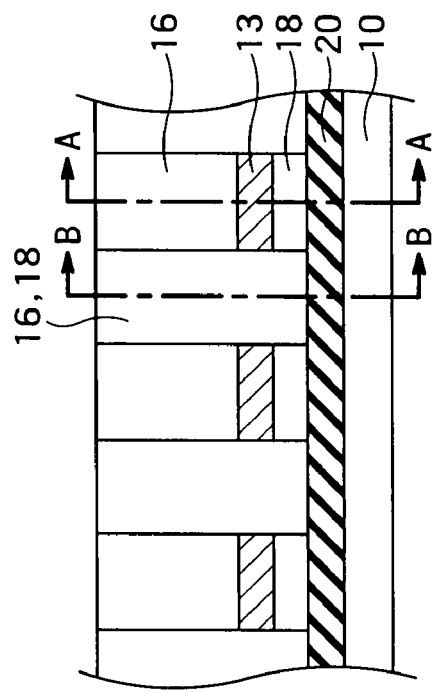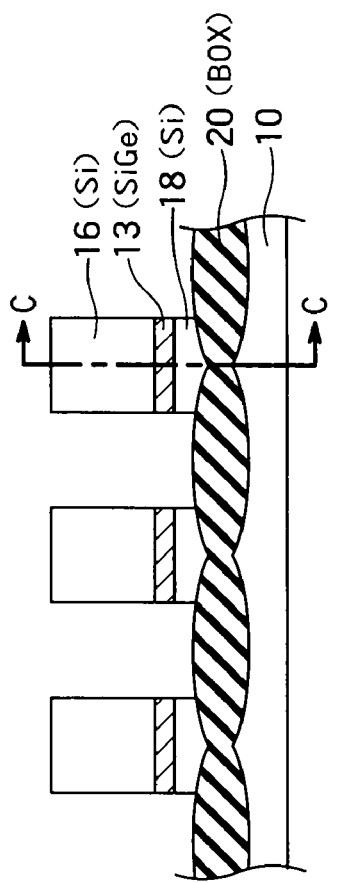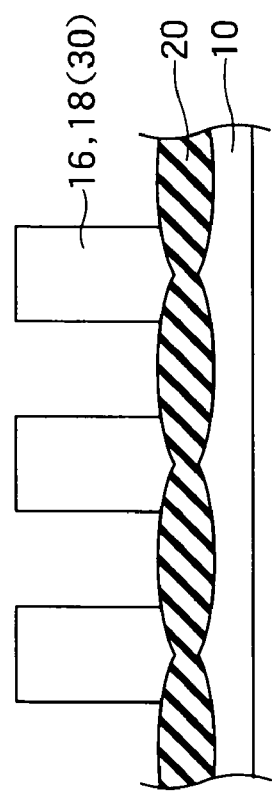
FIG. 18C
FIG. 18A
FIG. 18B

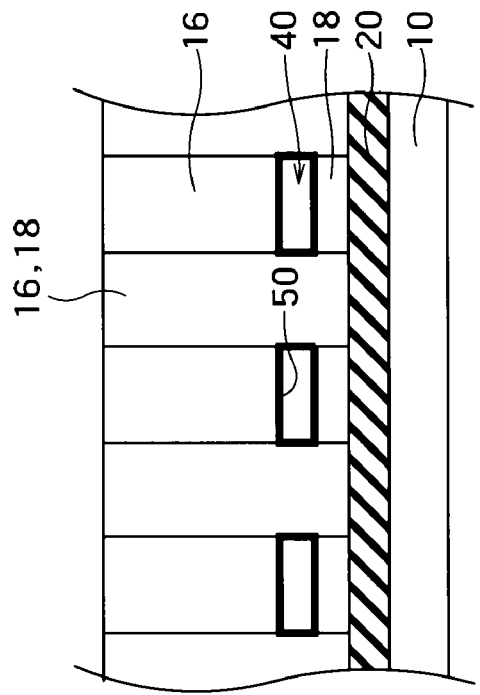
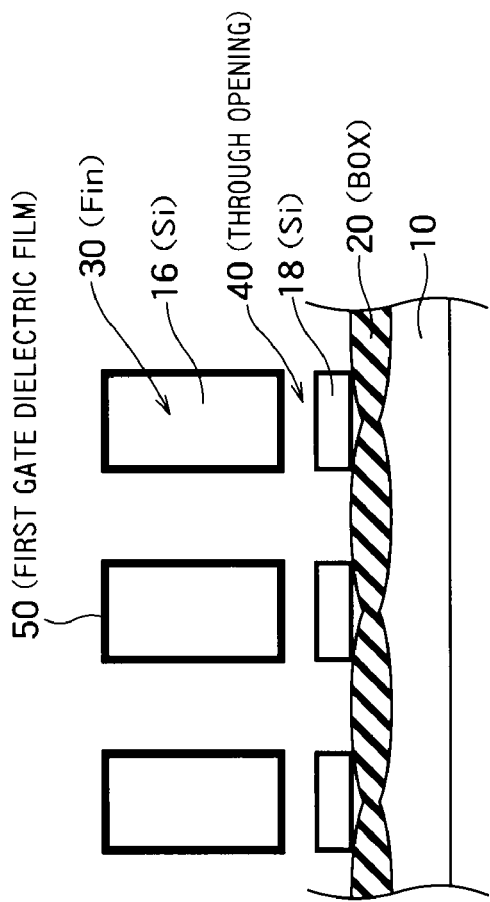

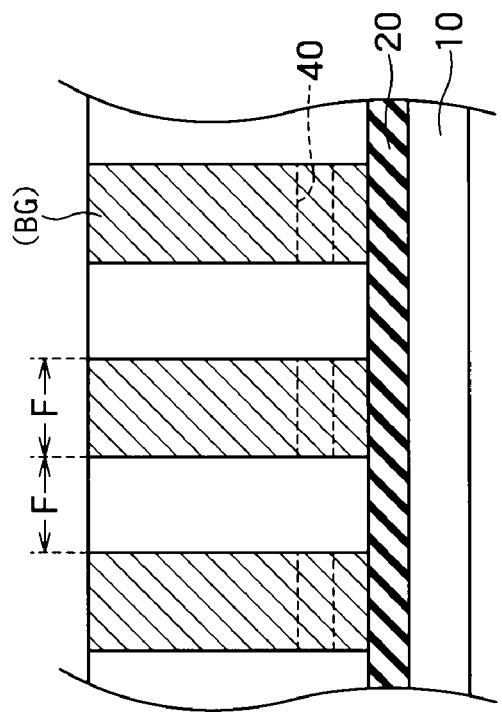
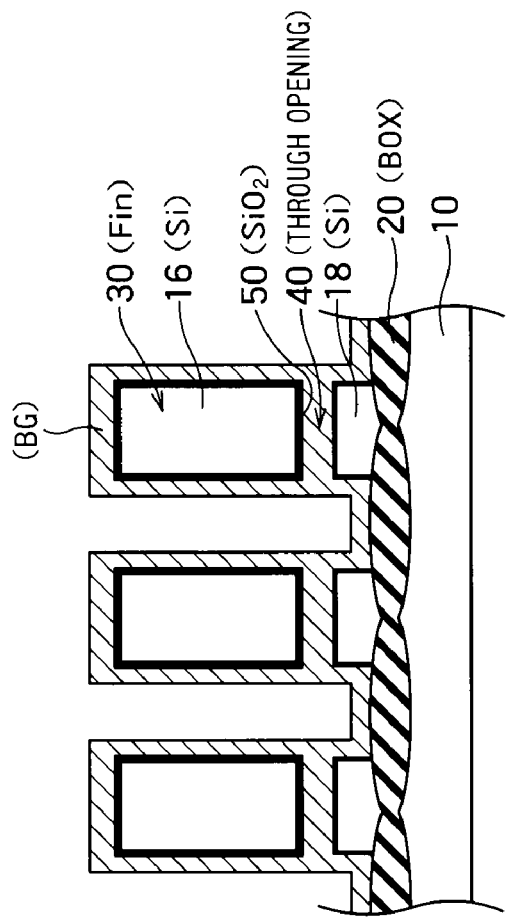
FIG. 20A
FIG. 20B

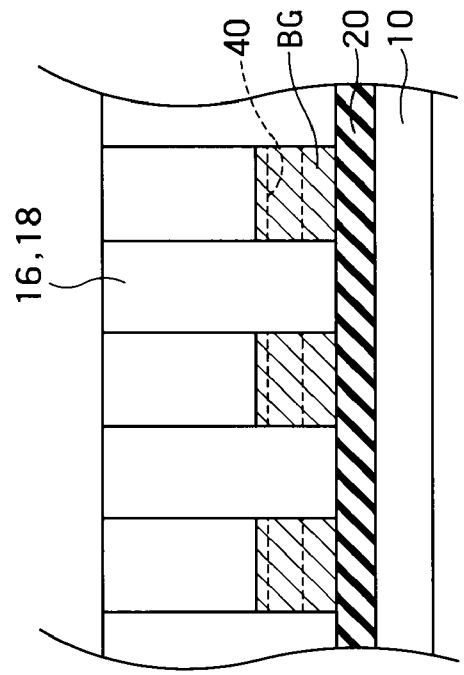
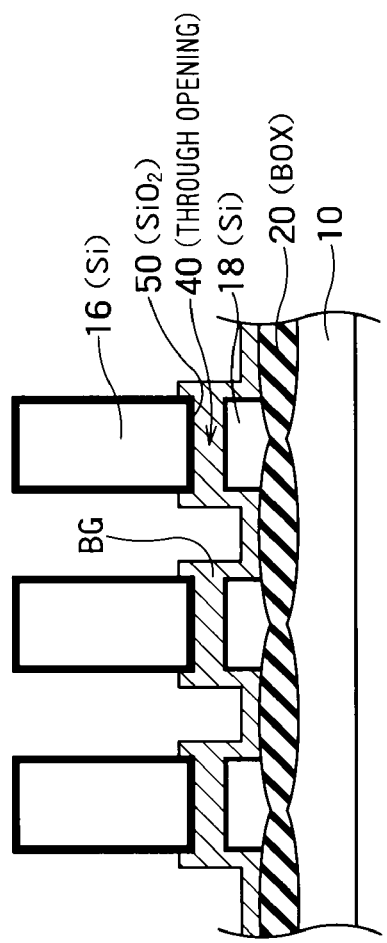

A-A

B-B

A-A

B-B

A-A

B-B

A-A

B-B

A-A

B-B

A-A

B-B

A-A

B-B

C-C

A-A

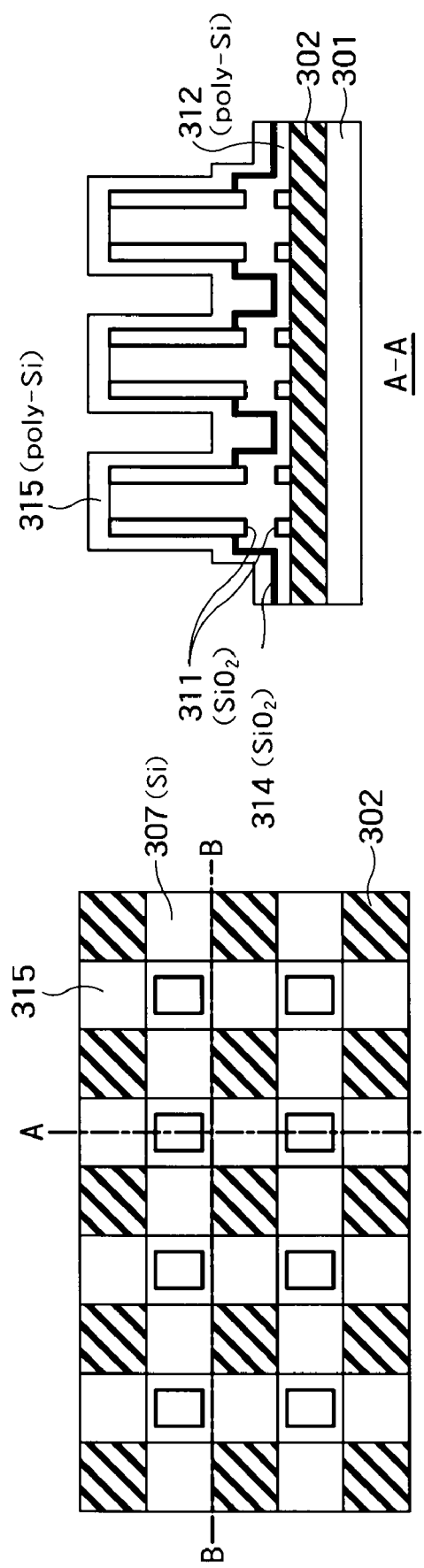
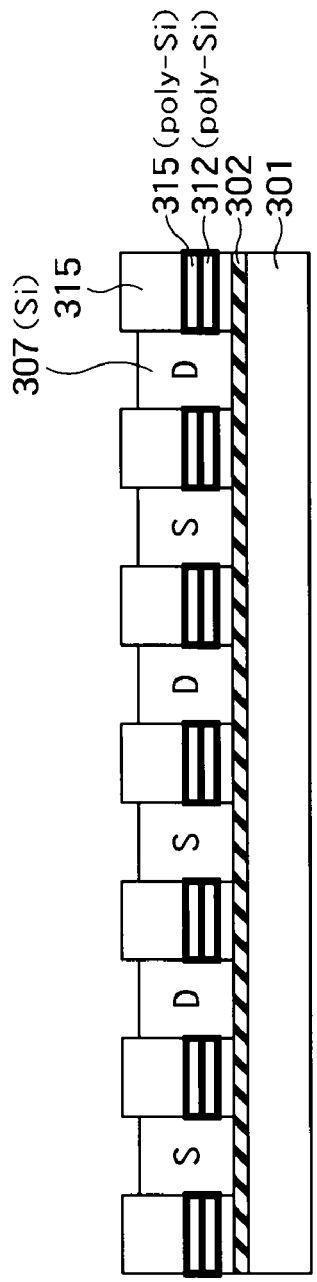
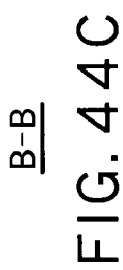
FIG. 44A
FIG. 44B
FIG. 44C

SEMICONDUCTOR MEMORY DEVICE AND MANUFACTURING METHOD THEREOF

CROSS-REFERENCE TO RELATED APPLICATIONS

This application is based upon and claims the benefit of priority from the prior Japanese Patent Applications No. 2007-107347, filed on Apr. 16, 2007, and 2008-090627, filed on Mar. 31, 2008, the entire contents of which are incorporated herein by reference.

FIELD OF THE INVENTION

The present invention relates to a semiconductor memory device and a manufacturing method thereof, for example an FBC (Floating Body Cell) memory device storing therein data by accumulating electric charges in each floating body and a manufacturing method thereof.

RELATED ART

In recent years, the FBC memory device has been known as a semiconductor memory device expected to replace a 1T (Transistor)-1C (Capacitor) DRAM. The FBC memory device is configured so that FETs (Field Effect Transistors) each including a floating body (hereinafter, also "body") are formed on an SOI (Silicon On Insulator) substrate, and so that data "1" or "0" is stored in each FET according to the number of majority carriers accumulated in the body of the FET.

Among the FBCs, development of a FD-FBC (Full-Depletion Floating Body Cell), in particular, is underway. The FD-FBC includes a back gate so as to increase a signal difference (potential difference) between data "0" and "1". It is preferable that a thickness of a buried oxide film (BOX) layer be small (e.g., equal to or smaller than 25 nm) so that the back gate can easily control a body bias. However, the thickness of the BOX layer is normally about 150 nm and it is technically difficult to reduce the thickness to be equal to or smaller than 50 nm.

To deal with the problem, a technique using a FinFET as the FBC is developed. When the FinFET is used as the FBC, thin gate dielectric films are formed on both side surfaces of a Fin semiconductor, and front gate electrodes are formed on the gate dielectric films, respectively. Since the front gate electrodes are formed on the both side surfaces of the Fin semiconductor, the signal difference (potential difference) between data "0" and "1" can be increased. In this case, the thickness of the BOX layer has no influence on characteristics of the FBC.

When the front gate electrodes are formed on the both side surfaces of the Fin semiconductor, respectively (the front gate electrodes are either Ω-shaped or π-shaped gate electrodes), only the same potential can be applied to the Fin semiconductor since the front gate electrodes are connected to each other on an upper surface of the Fin semiconductor. Accordingly, when the front gate electrodes are the Ω-shaped or π-shaped gate electrodes, it is difficult to form a back gate electrode capable of applying to the body a potential different from that applied by the front gate electrodes during a data holding period. Further, the conventional FinFET is disadvantageously high in cost because of the use of an SOI substrate.

SUMMARY OF THE INVENTION

A semiconductor memory device according to an embodiment of the present invention comprises a substrate; an insulating film provided above the substrate; a semiconductor layer provided above the insulating film and extending in a plane which is parallel to a surface of the substrate; a first gate dielectric film provided on an inner wall of a opening penetrating through the semiconductor layer; a first gate electrode penetrating through the opening and isolated from the semiconductor layer by the first gate dielectric film; a second gate dielectric film formed on a side surface and an upper surface of the semiconductor layer located on the first gate electrode; and a second gate electrode provided on the side surface and the upper surface of the semiconductor layer via the second gate dielectric film, isolated from the first gate electrode, and superimposed on the first gate electrode.

A method of manufacturing a semiconductor memory device according to an embodiment of the present invention, the method comprises forming a first material layer in a gate electrode formation region on a bulk silicon substrate, the first material layer extending a direction; forming a semiconductor layer on the bulk silicon substrate and the first material layer to cross an extension direction of the first material layer; forming a trench penetrating through the first material layer and reaching the bulk silicon substrate by etching the first material layer and the bulk silicon substrate uncovered with the semiconductor layer; forming a sidewall film on a side surface of the trench; forming a buried oxide film below the semiconductor layer and the first material layer by oxidizing the bulk silicon substrate located on a bottom of the trench; forming a opening penetrating through the semiconductor layer by removing the first material layer; forming a first gate dielectric film on an inner wall of the opening; forming a first gate electrode in the opening; forming a second gate dielectric film on a side surface and an upper surface of the semiconductor layer located on the first gate electrode; and forming a second gate electrode on the second gate dielectric film.

A method of manufacturing a semiconductor memory device according to an embodiment of the present invention, the method comprises forming a first material layer in a gate electrode formation region on a bulk silicon substrate, the first material layer extending a direction; growing a monocrystalline silicon layer on the silicon substrate and the first material layer; forming a stripe mask material on the monocrystalline silicon layer, the stripe mask material extending in an orthogonal direction to the extension direction of the first material layer; forming a trench penetrating through the first material layer and reaching the bulk silicon substrate by removing the monocrystalline silicon layer, the first material layer, and upper portions of the silicon substrate using the mask material as a mask; forming a side wall on a inner side surface of the trench; forming a buried oxide film below the monocrystalline silicon layer and the first material layer by oxidizing the bulk silicon substrate located on a bottom of the trench; forming a opening penetrating through the monocrystalline silicon layer by removing the first material layer; forming a first gate dielectric film on an inner wall of the opening; forming a first gate electrode in the opening; forming a second gate dielectric film on a side surface and an upper surface of the monocrystalline silicon layer located on the first gate electrode; and forming a second gate electrode on the second gate dielectric film.

BRIEF DESCRIPTION OF THE DRAWINGS

FIGS. 4 to 22 are cross-sectional views or plan views showing the method of manufacturing the FBC memory device according to the first embodiment;

FIGS. 26 to 46 show a manufacturing method according to the third embodiment.

DETAILED DESCRIPTION OF THE INVENTION

Embodiments of the present invention will be explained below in detail with reference to the accompanying drawings. Note that the invention is not limited thereto.

First Embodiment

Figure 1:
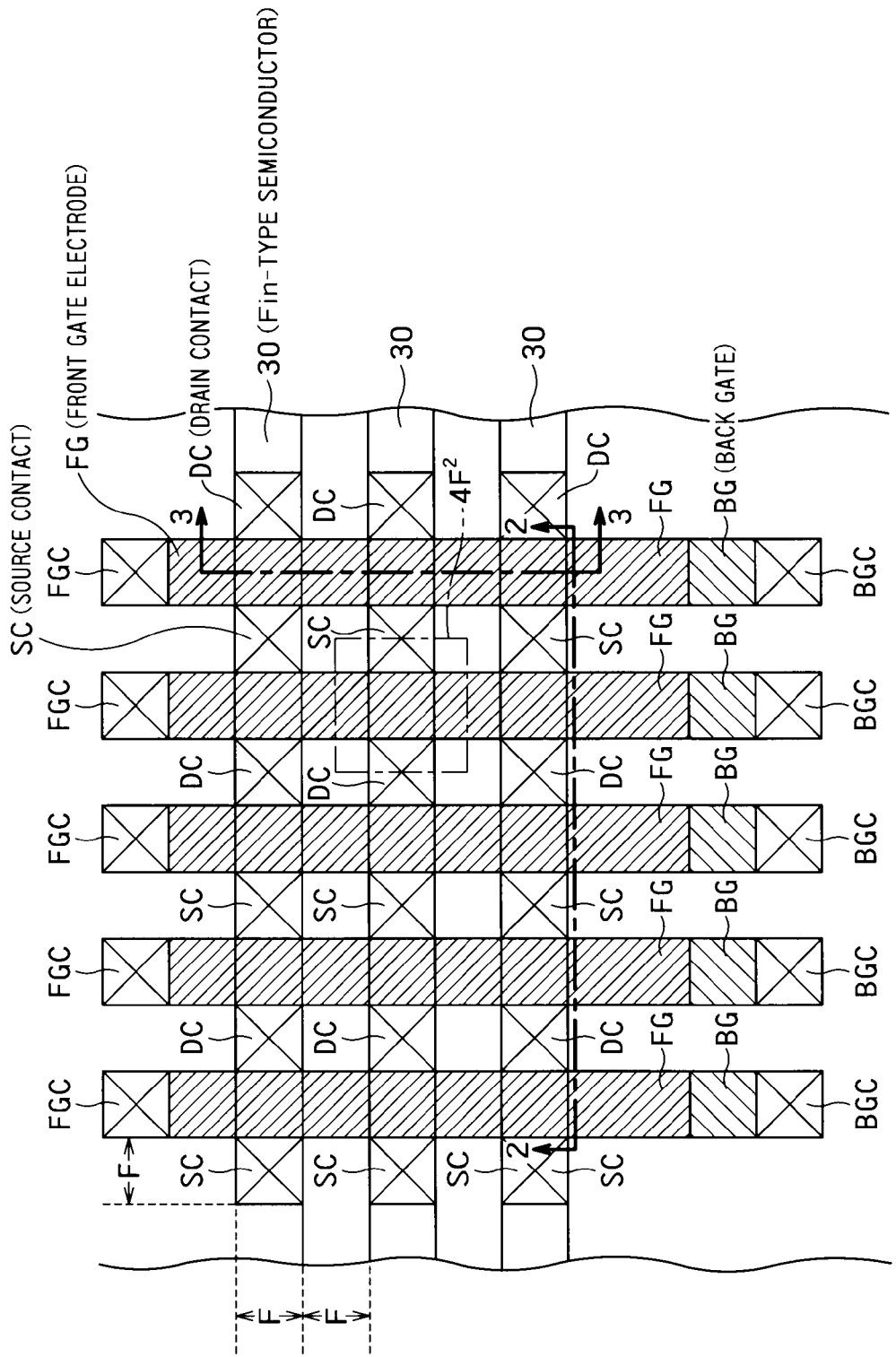
FIG. 1 is a plan view of an FBC memory device according to a first embodiment of the present invention.
Figure 2:
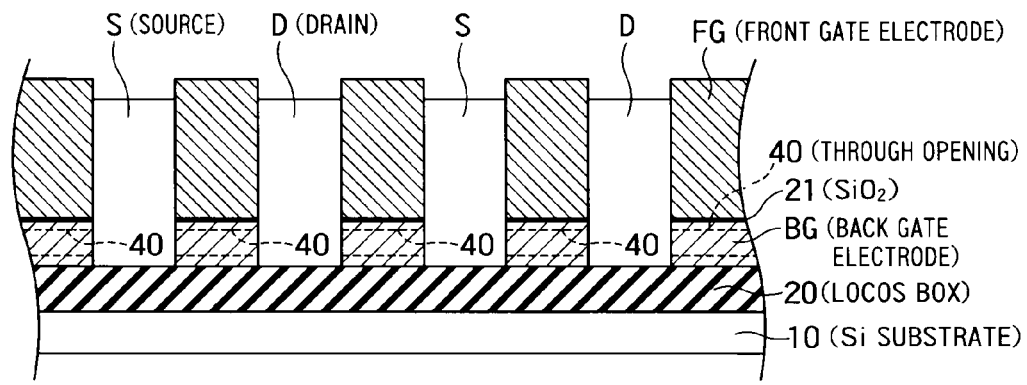
FIG. 2 is a cross-sectional view taken along a line 2-2 of FIG. 1.
Figure 3:
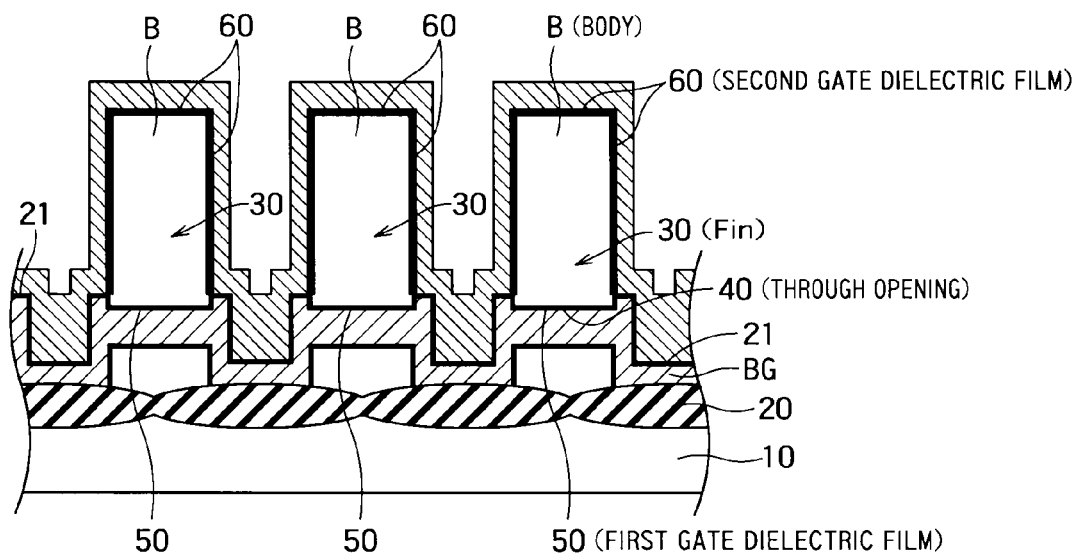
FIG. 3 is a cross-sectional view taken along a line 3-3 of FIG. 1.
Figure 4:
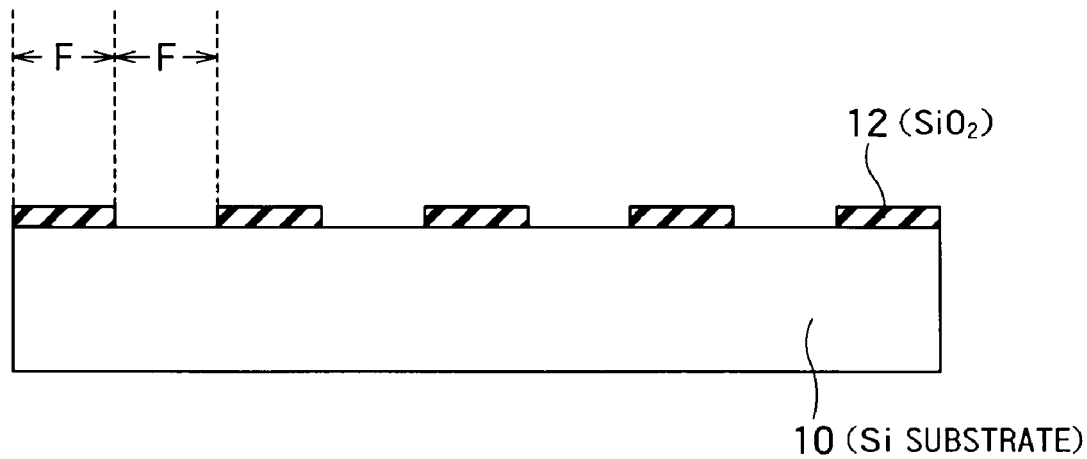

FIG. 1 is a plan view of an FBC memory device according to a first embodiment of the present invention. FIG. 2 is a cross-sectional view taken along a line 2-2 of FIG. 1. FIG. 3 is a cross-sectional view taken along a line 3-3 of FIG. 1. FIG. 1 shows a structure of layers lower than a layer of contacts. The FBC memory device includes Fin semiconductors 30 formed into stripes and extending in a first direction. The Fin semiconductors 30 have elongated shape and extend in a plane parallel to a surface of a silicon substrate. The Fin semiconductors 30 have a certain degree of height on the basis of the surface of the silicon substrate.

Front gate electrodes FG and back gate electrodes BG extend in a direction almost orthogonal to the extension direction of the Fin semiconductors 30. The front gate electrodes FG are provided on both side surfaces and upper surfaces of the Fin semiconductors 30. The back gate electrodes BG are provided to penetrate through the Fin semiconductors 30. In the plan view shown in FIG. 1, the front gate electrodes FG are superimposed on the corresponding back gate electrodes BG. Due to this, the back gate electrodes BG are not sufficiently shown in FIG. 1. Actually, however, as shown in FIG. 3, the back gate electrodes BG penetrate through the Fin semiconductors 30 and extend to just before front gate contacts FGC. As shown in FIGS. 2 and 3, the front gate electrodes FG are isolated from the back gate electrodes BG by an inter-gate dielectric film 21. The inter-gate dielectric film 21 is, for example, a silicon oxide film.

As shown in FIGS. 2 and 3, the Fin semiconductors 30 are provided above a LOCOS-BOX (Local Oxidized Silicon-Buried Oxide) layer (hereinafter, "BOX layer" or "LOCOS BOX") 20 serving as an insulating film formed on a silicon substrate 10. Since the BOX layer 20 is formed by an LOCOS process, bird's beaks are formed under the Fin semiconductors 30. The BOX layer 20 is formed to be relatively thick so as to ensure isolating of the Fin semiconductors 30 and the back gate electrodes BG from the silicon substrate 10.

As shown in FIG. 3, through openings 40 are formed in the Fin semiconductors 30 provided above the BOX layer 20. A first gate dielectric film 50 is formed on an inner wall of each through opening 40. Each back gate electrode BG serving as a first gate electrode penetrates through the through opening 40. The back gate electrodes BG are isolated from the Fin semiconductors 30 by the first gate dielectric film 50. The back gate electrodes BG are also isolated from the silicon substrate 10 by the BOX layer 20. A second gate dielectric film 60 is formed on side surfaces and an upper surface of each Fin semiconductor 30. Each front gate electrode FG serving as a second gate electrode is formed on the side surfaces and the upper surface of each Fin semiconductor 30 via the second gate dielectric film 60. In this manner, the front gate electrodes FG are formed to creep along on the side surfaces and upper surfaces of the Fin semiconductors 30. Because of the shape, the front gate electrode FG is also called "the Ω-shaped or π-shaped gate electrode".

As shown in FIG. 3, a body B is formed in each of the Fin semiconductors 30 right under the front gate electrode FG, and majority carriers are accumulated into or emitted from the body B to store data. As shown in FIG. 2, source layers S and drain layers D are formed on the Fin semiconductors 30 adjacent to both sides of the bodies B.

Each front gate electrode FG is connected to a wiring (not shown) via a front gate contact FGC, and each back gate electrode BG is connected to a wiring (not shown) via a back gate contact BGC. As shown in FIG. 1, the front gate contacts FGC and the back gate contacts BGC are provided on opposite sides across the Fin semiconductors 30. Accordingly, different voltages can be applied to the front gate electrodes FG and the back gate electrodes BG, respectively. The source layers S are connected to source lines (not shown) via source contacts SC, respectively. The drain layers D are connected to bit lines (not shown) via drain contacts DC. The bit lines extend in an orthogonal direction to the extension direction of the front gate electrodes FG and the back gate electrodes BG. Namely, the extension direction of the bit lines is parallel to the extension direction of the Fin semiconductors 30. The source lines extend in a parallel direction to the extension direction of the front gate electrodes FG and the back gate electrodes BG.

The Fin semiconductors 30 are made of, for example, single crystal silicon. The first and second gate dielectric films 50 and 60 are, for example, silicon oxide films or silicon oxynitride films, or are made of high dielectric (e.g., HfSiO) having a higher relative dielectric constant than that of the silicon oxide film. The front gate electrodes FG and the back gate electrodes BG are made of, for example, polysilicon.

According to the first embodiment, the through openings 40 are provided below the Fin semiconductors 30 and the back gate electrodes BG penetrate through the through openings 40, respectively. By so configuring, the front gate electrodes FG can be superimposed on the back gate electrodes BG while being isolated from each other. Furthermore, the back gate contacts BGC and the front gate contacts FGC are provided on opposite sides across memory cell arrays. Due to this, the back gate electrodes BG and the front gate electrodes FG can apply different voltages to the bodies B via the first gate dielectric film 50 and the second gate dielectric film 60, respectively. When each of memory cells is constituted by, for example, an nMISFET, the front gate electrodes FG apply high level potential to the bodies B and the bit lines (not shown) apply high level potential to the drain layers D during a data write operation. This generates impact ionization on an interface between each drain layer D and each body B, thus accumulating holes in the body B. During a data storage operation, the back gate electrodes BG apply low level potential to the corresponding bodies B. Potential wells are thereby formed in the bodies B and holes in the bodies B are held.

According to the first embodiment, the memory cells can be satisfactorily downsized since the front gate electrodes FG are superimposed on the back gate electrodes BG. For example, according to the first embodiment, one cell unit can be formed in a region of 4 $F^2$ as shown in FIG. 1, where F denotes a Feature size which means a minimum line width that can be formed by lithography in a certain generation.

A method of manufacturing the FBC memory device according to the first embodiment will be described. FIGS. 4 to 22 are cross-sectional views or plan views showing the method of manufacturing the FBC memory device according to the first embodiment. A bulk silicon substrate (hereinafter, "substrate") 10 is prepared. The substrate 10 is made of p-type monocrystalline silicon at an impurity concentration of $1\times10^{16}$ cm$^{-3}$ to $1\times10^{17}$ cm$^{-3}$. The substrate 10 can be used as an nMIS channel region as it is. A silicon oxide film 12 at a thickness of about 200 nanometers (nm) is deposited on the substrate 10. The silicon oxide film 12 on a surface of the substrate 10 in a surface region in which the back gate electrodes BG are to be formed is removed by the lithography and RIE (Reactive Ion Etching). At this time, the silicon oxide film 12 is formed into stripes with each of a line width and a space width set to F (Feature size).

Figure 5:
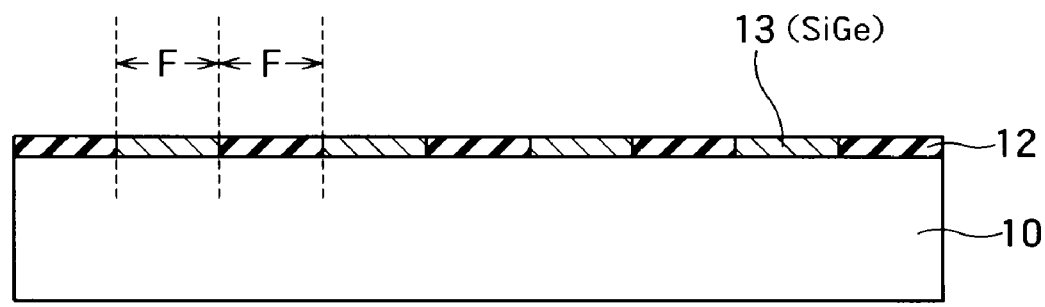
Figure 6:
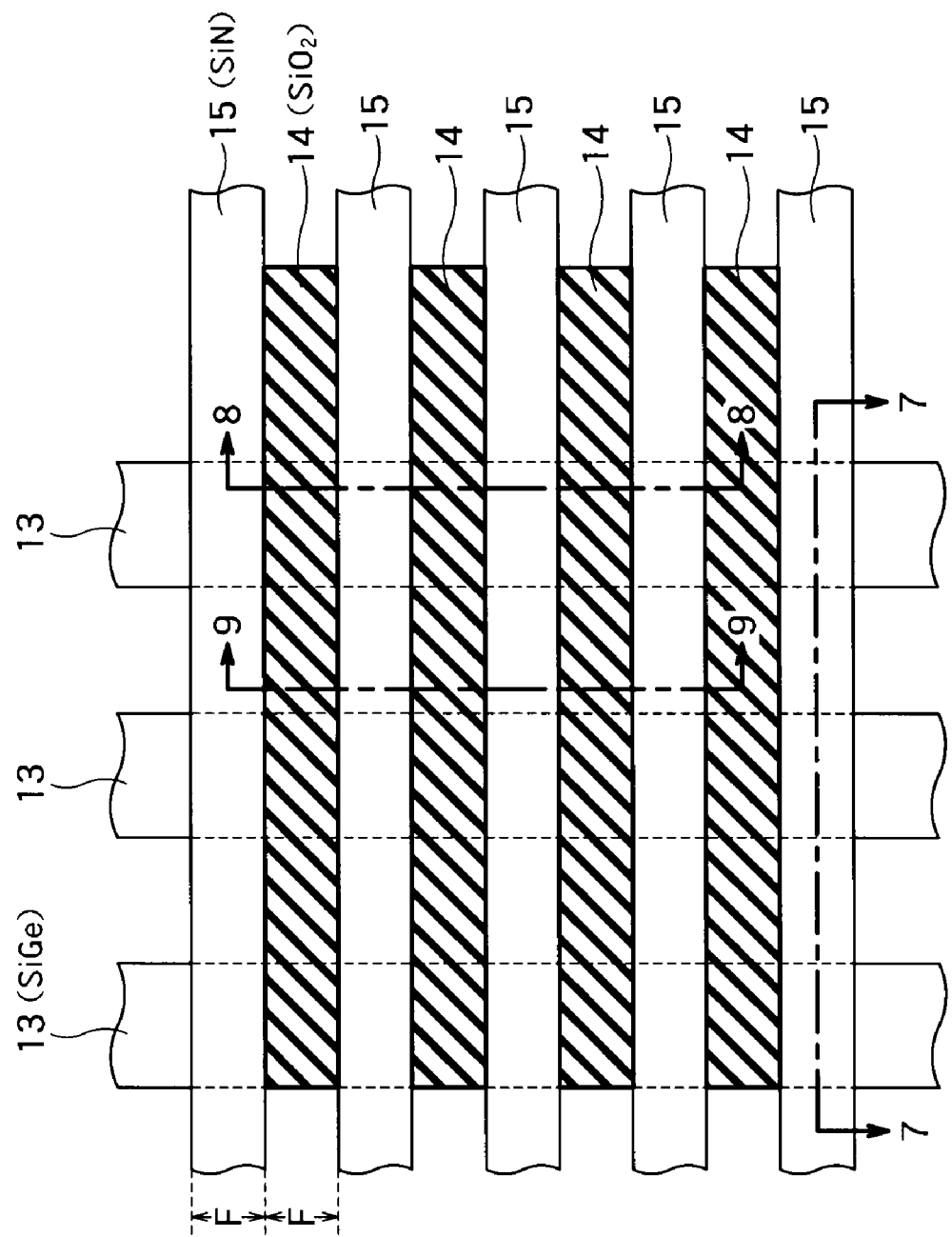

As shown in FIG. 5, a monocrystalline silicon germanium layer 13 at a thickness of about 200 nm is selective-epitaxially grown in the exposed surface region of the substrate 10.

Figure 7:
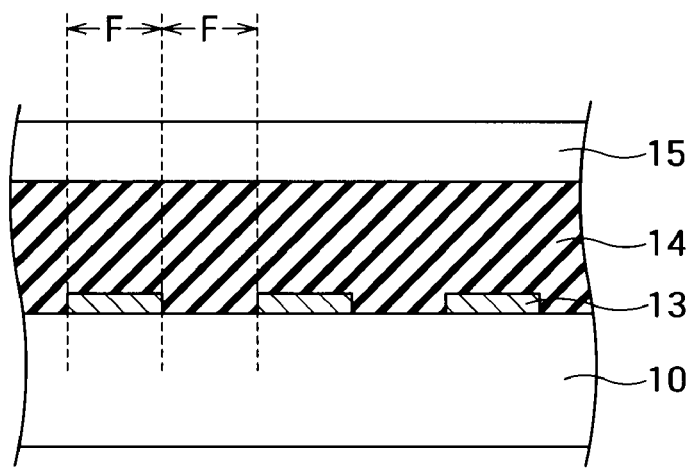
Figure 8:
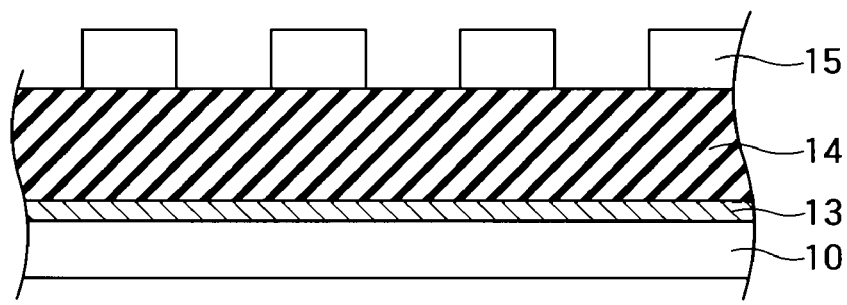
Figure 9:
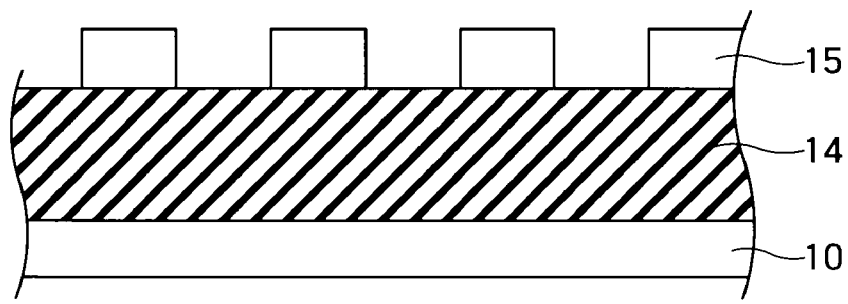
Figure 10A:
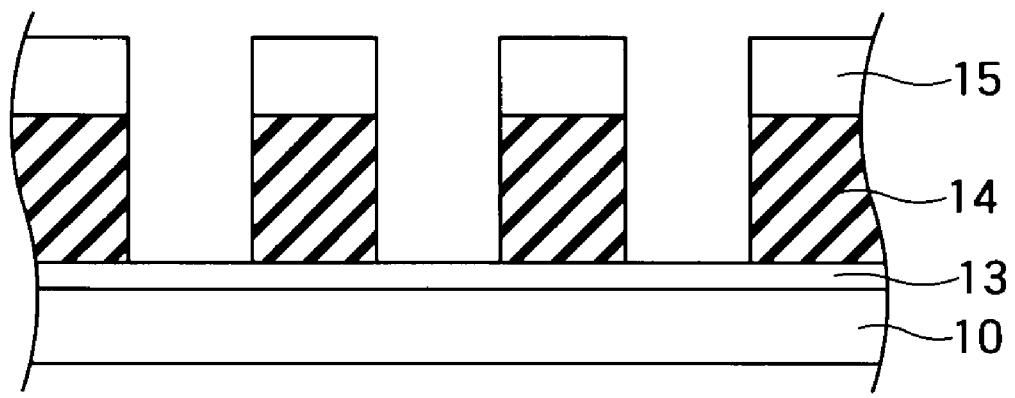
Figure 10B:
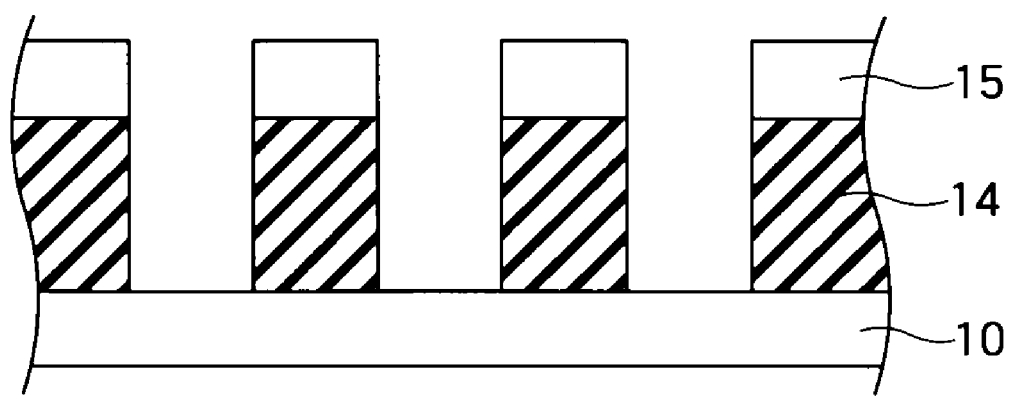

A silicon oxide film 14 at a height of about 2 F is deposited on a structure shown in FIG. 5. A silicon nitride film 15 serving as a mask material is deposited on the silicon oxide film 14. A polysilicon layer can be used as the film 15 in place of the silicon nitride film. Next, as shown in the plan view of FIG. 6, the silicon nitride film 15 is worked into stripes using the lithography and the RIE. An extension direction of the silicon nitride film 15 at this time is orthogonal to an extension direction of the silicon germanium layer 13. Each of a line width and a space width of the silicon nitride film 15 is F. FIG. 7 is a cross-sectional view taken along a line 7-7 of FIG. 6. FIG. 8 is a cross-sectional view taken along a line 8-8 of FIG. 6. FIG. 9 is a cross-sectional view taken along a line 9-9 of FIG. 6.

Using the silicon nitride film 15 as a mask, the silicon oxide film 14 is etched by the RIE until the silicon germanium layer 13 and the substrate 10 are exposed. As a result, a structure shown in FIG. 8 is changed to that shown in FIG. 10A. A structure shown in FIG. 9 is changed to that shown in FIG. 10B.

Figure 11B:
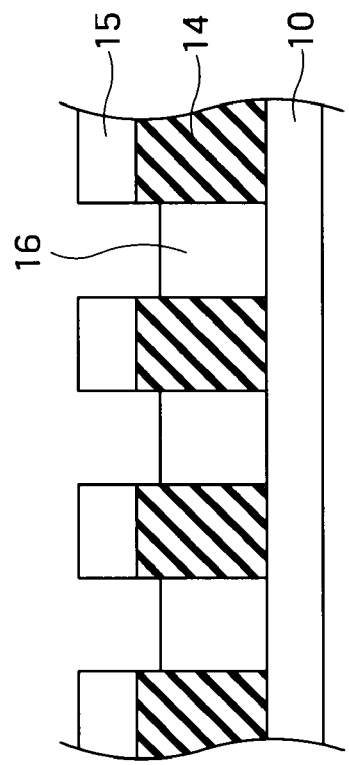
Figure 11A:
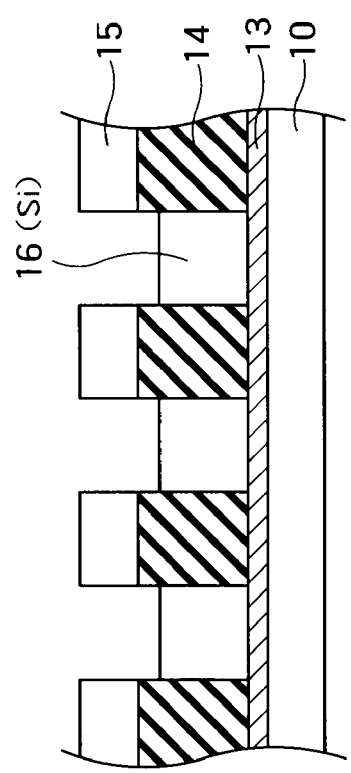

As shown in FIGS. 11A and 11B, a monocrystalline silicon layer 16 at a thickness of 1.5 F is selectively and epitaxially grown on the exposed silicon substrate 10 and silicon germanium layer 13. FIGS. 11A and 11B are cross-sectional views showing a manufacturing step continuous to that shown in FIGS. 10A and 10B, respectively. The silicon layer 16 is used as a Fin semiconductor in a later step.

Using CMP (Chemical Mechanical Polishing), the silicon nitride film 15 is removed. As a result, a structure shown in FIGS. 12A and 12B is obtained. At this time, an upper surface of the silicon layer 16 is located at a position lower than an upper surface of the silicon oxide film 14 on the basis of a surface of the substrate 10.

Figure 13A:
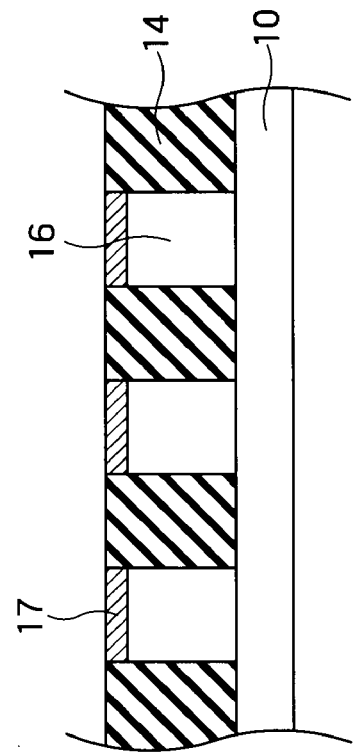
Figure 13B:
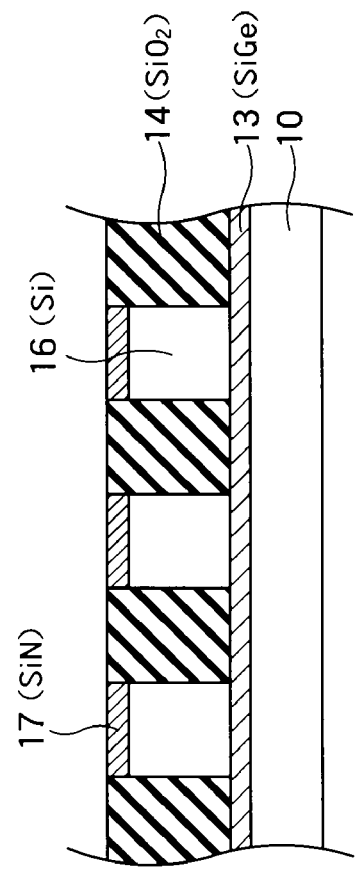

A silicon nitride film is deposited on the silicon layer 16 and the silicon oxide layer 14, and polished by the CMP. As shown in FIGS. 13A and 13B, the silicon nitride film 17 remains on the silicon layer 16.

Figure 14B:
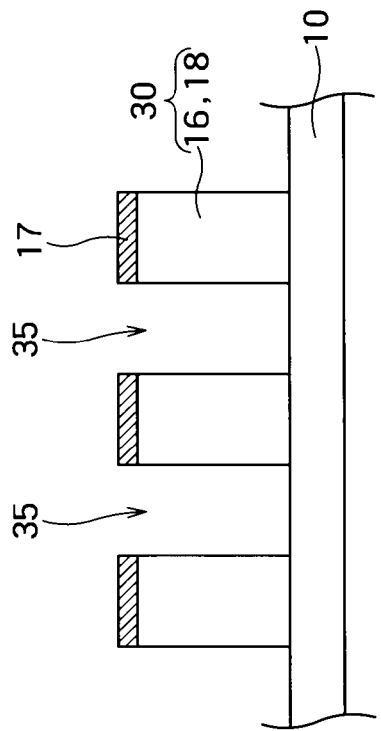
Figure 14A:
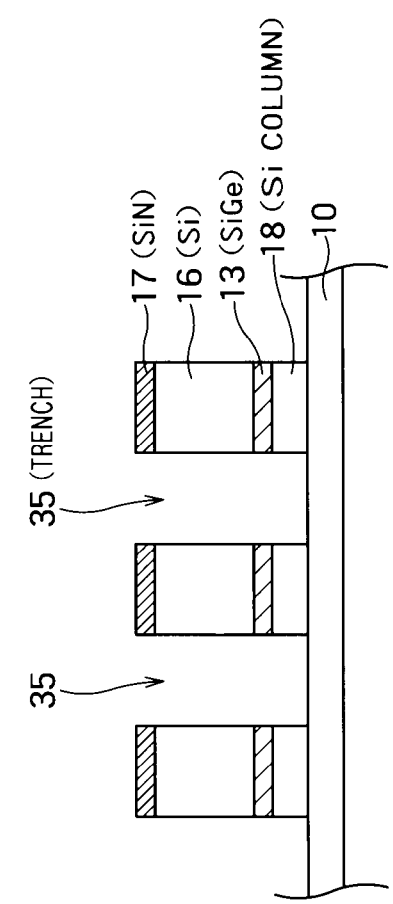
Figure 15:
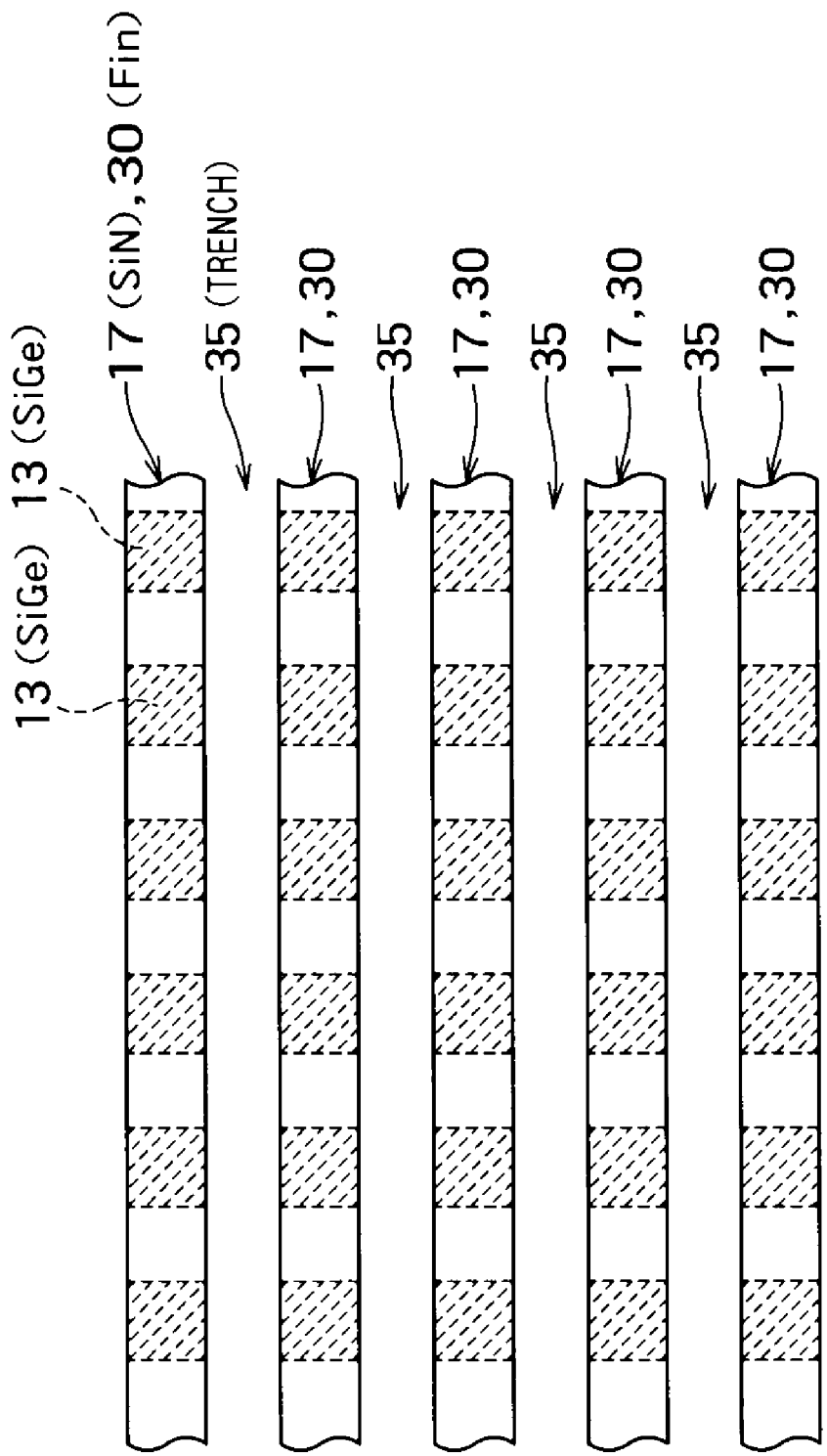

The silicon oxide film 14 is removed using an ammonium fluoride solution. Using the silicon nitride film 17 as a mask, the silicon germanium layer 13 is etched by anisotropic plasma etching (RIE), and the substrate 10 is then etched by about 400 nm. As a result, as shown in FIGS. 14A and 14B, trenches 35 are formed to penetrate through the silicon germanium layer 13 and to reach the silicon substrate 10. Furthermore, silicon columns 18 are formed under the silicon germanium layer 13. The silicon columns 18 are provided in the same plane region as that of the silicon layer 16. Accordingly, in regions in which the silicon germanium layer 13 is not present, the silicon columns 18 are integral with the silicon layer 16, as shown in FIG. 14B. Accordingly, the silicon layer 16 corresponds to "Fin semiconductors" 30, or both of the silicon layer 16 and the silicon columns 18 correspond to the "Fin semiconductors" 30. The Fin semiconductors 30 extend in a direction orthogonal to the extension direction of the silicon germanium layer 13. Therefore, by etching the silicon germanium layer 13 using the silicon nitride film 17 formed on the Fin semiconductors 30 as a mask, the silicon germanium layer 13 remains only in shaded areas shown in the plan view of FIG. 15.

Figure 16A:
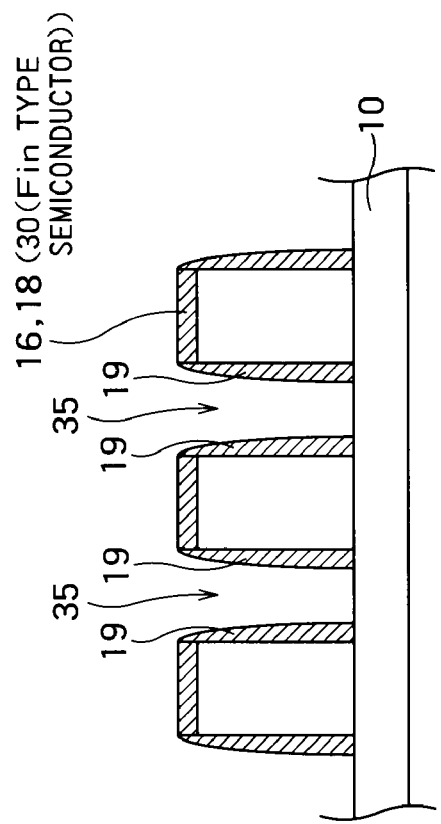
Figure 16B:
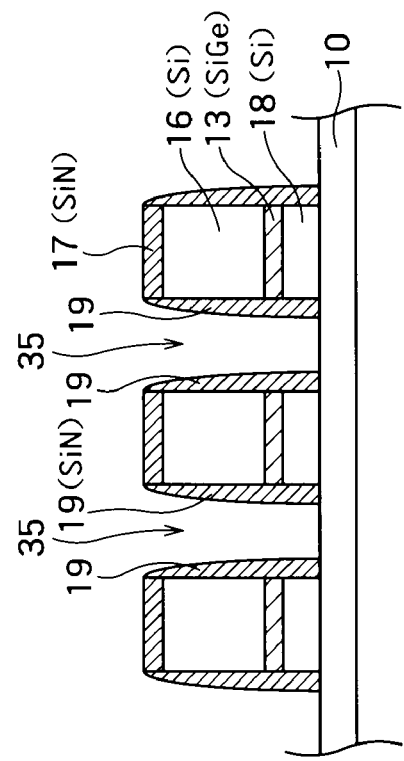
Figure 17B:
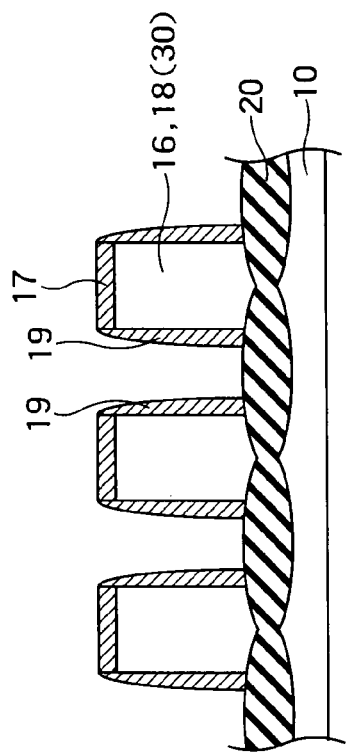
Figure 17A:
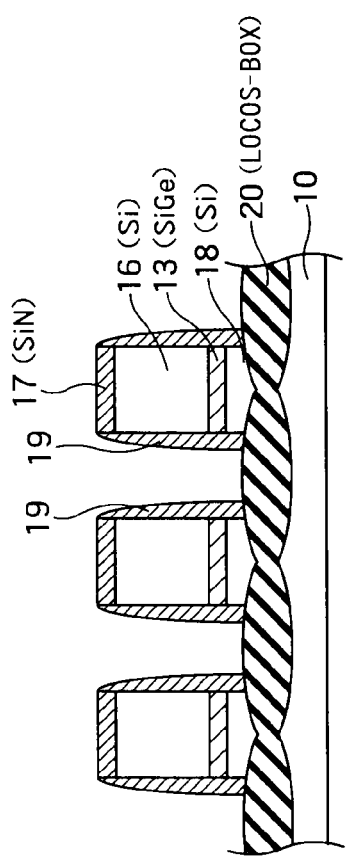

As shown in FIGS. 16A and 16B, a sidewall film 19 constituted by a silicon nitride film is formed on side surfaces of the silicon columns 18, the silicon germanium layer 13, the silicon layer 16, and the silicon nitride film 17. Namely, the sidewall film 19 is formed on each of side surfaces of the trenches 35. As shown in FIGS. 17A and 17B, the exposed surface regions of the silicon substrate 10 between the respective adjacent silicon layers 16 are thermally oxidized. Namely, using the silicon nitride film 17 and the sidewall film 19 as a mask, the silicon substrate 10 on bottoms of the trenches 35 is subjected to LOCOS oxidization. As a result, lower portions of the silicon columns 18 are oxidized and bird's beaks are formed under the silicon columns 18. The LOCOS oxidation is continued until the adjacent bird's beaks contact with each other under each of the silicon columns 18 and the silicon columns 18 are isolated from the substrate 10. As a result, the LOCOS-BOX 20 is formed below the Fin semiconductors 30 and the silicon germanium layer 13.

During this LOCOS oxidation, when the silicon germanium layer 13 is oxidized, the Fin semiconductors 30 may possibly fall down by a volume expansion of the layer 13. It is, therefore, necessary to prevent the LOCOS-BOX 20 from reaching the silicon germanium layer 13. In the step shown in FIG. 14, the silicon columns 18 are formed under the silicon germanium layer 13, whereby the LOCOS-BOX 20 can be formed under the Fin semiconductors 30 without oxidizing the silicon germanium layer 13.

Next, as shown in FIGS. 18A and 18B, the silicon nitride film 17 and the sidewall film 19 are removed using a hot phosphoric acid solution. FIG. 18C corresponds to the cross section taken along the line 7-7 of FIG. 6 (along the Fin semiconductors 30). FIG. 18A is a cross-sectional view taken along a line A-A of FIG. 18C, and FIG. 18B is a cross-sectional view taken along a line B-B of FIG. 18C. To help understand, cross sectional views subsequent to FIG. 18A are denoted by FIG. xA and those subsequent to FIG. 18B are denoted by FIG. xB, where x is from 19 to 22.

Using a mixture solution of hydrofluoric acid and acetic acid, the silicon germanium layer 13 exposed between the silicon layer 16 and each of the silicon columns 18 is removed. As a result, as shown in FIGS. 19A and 19B, the through openings 40 penetrating through the respective Fin semiconductors 30 are formed. Furthermore, the first gate dielectric film 50 is formed on the inner wall of each of the through openings 40 by thermal oxidation. The first gate dielectric film 50 is a silicon oxide film at a thickness of about 5 nm. As a result of this thermal oxidation, silicon oxide films are similarly formed on side surfaces of the silicon layer 16 and the silicon columns 18 in FIG. 19A.

As shown in FIG. 20, a material of the back gate electrodes BG is deposited on the structure shown in FIGS. 19A and 19B. At this time, the electrode material (BG) is deposited to be filled up in the through openings 40. The electrode material (BG) is polysilicon heavily doped with phosphor, and a thickness of the deposited electrode material (BG) is about 100 nm. Next, the electrode material (BG) is etched into stripes by the lithography and the RIE as shown in FIG. 20B. At this time, each of a line width and a space width of the electrode material (BG) is F. Lines of the electrode material (BG) are set to include the corresponding through openings 40. An extension direction of the electrode material (BG) is orthogonal to the extension direction of the Fin semiconductors 30.

Figure 21B:
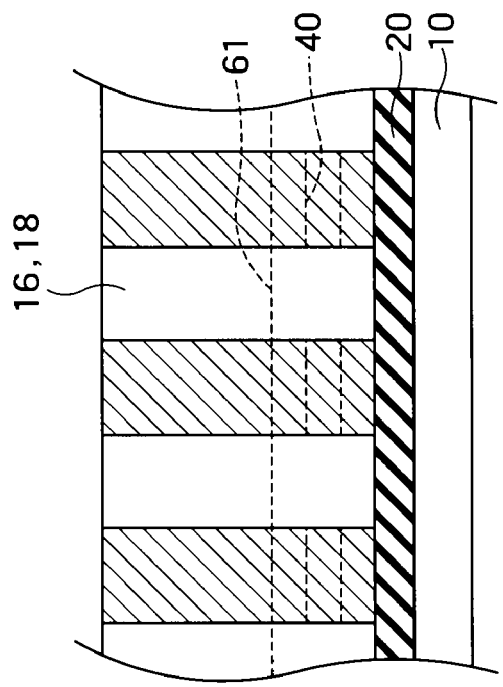
Figure 21A:
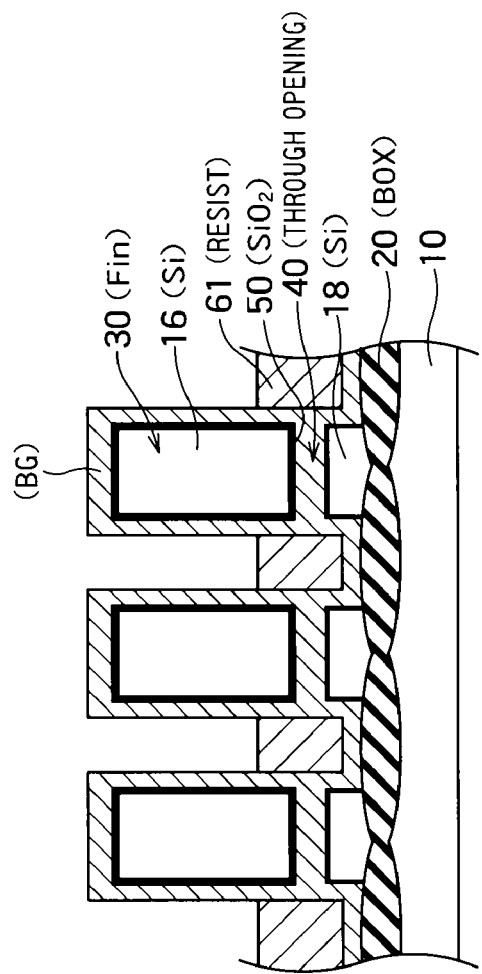

After a photoresist 61 is applied onto the structure shown in FIGS. 20A and 20B, the photoresist 61 is etched back as shown in FIGS. 21A and 21B. At this time, the photoresist 61 is etched back so that an upper surface of the photoresist 61 is located at a higher level than that of an upper end of the through opening 40. Using the photoresist 61 as a mask, the electrode material (BG) is etched by isotropic plasma etching (CDE (Chemical Dry Etching)). The resist 61 is then removed, thereby forming the back gate electrodes BG as shown in FIGS. 22A and 22B.

As shown in FIGS. 2 and 3, the gate dielectric film 21 is formed on the surface of each of the back gate electrodes BG by performing thermal oxidation again, and the second gate dielectric film 60 is formed on the upper surface and side surfaces of each of the Fin semiconductors 30. Further, a material of the front gate electrodes FG is deposited on the Fin semiconductors 30 and the back gate electrodes BG. The electrode material (FG) is polysilicon heavily doped with phosphor and a thickness of the deposited electrode material (FG) is about 100 nm. Using the lithography and the RIE, the electrode material (FG) is etched into stripes as shown in FIG. 2. At this time, each of a line width and a space width of the electrode material FG is F. Lines of the electrode material (FG) are superimposed on the back gate electrodes BG. As a result, the front gate electrodes FG shown in FIGS. 2 and 3 are formed.

Using the front gate electrodes FG as a mask, n impurity ions are implanted into the structure shown in FIGS. 2 and 3, thereby forming the source layer S and the drain layer D in a self-aligned fashion. An impurity concentration of each of the source layer S and the drain layer D is about $1 \times 10^{20}$ cm$^{-3}$. Next, high temperature annealing at 1000 degrees or higher is performed, thereby activating impurities of the source layer S and the drain layer D.

Thereafter, interlayer dielectric films, contacts, wirings, and the like are formed by conventional methods. At this time, the bit lines are formed to extend in parallel to the extension direction of the Fin semiconductors 30, and the source lines are formed to extend in a perpendicular direction to the extension direction of the Fin semiconductors 30. The front gate contacts FGC and the back gate contacts BGC are formed on the opposite sides to each other across the Fins semiconductors 30 (memory cell array). Although the front gate electrodes FG are superimposed on the back gate electrodes BG, the front gate electrodes FG are isolated from the back gate electrodes BG by the gate dielectric film 21. Accordingly, different voltages can be applied to the front gate electrodes FG and the back gate electrodes BG, respectively.

In the first embodiment, by using the LOCOS-BOX 20, the Fin semiconductors 30 can be formed from the bulk silicon substrate 10. Further, the back gate electrodes BG that can control voltage independently from the front gate electrodes FG can be formed under the front gate electrodes FG so that the front gate electrodes FG are superimposed on the back gate electrodes BG. According to the first embodiment, the Fin FBC memory device can be manufactured at low cost by using not the SOI substrate but the bulk silicon substrate 10.

Second Embodiment

A second embodiment of the present invention differs from the first embodiment in a method of forming Fin semiconductors. Other configurations and manufacturing methods of the second embodiment are the same as those of the first embodiment.

Figure 23:
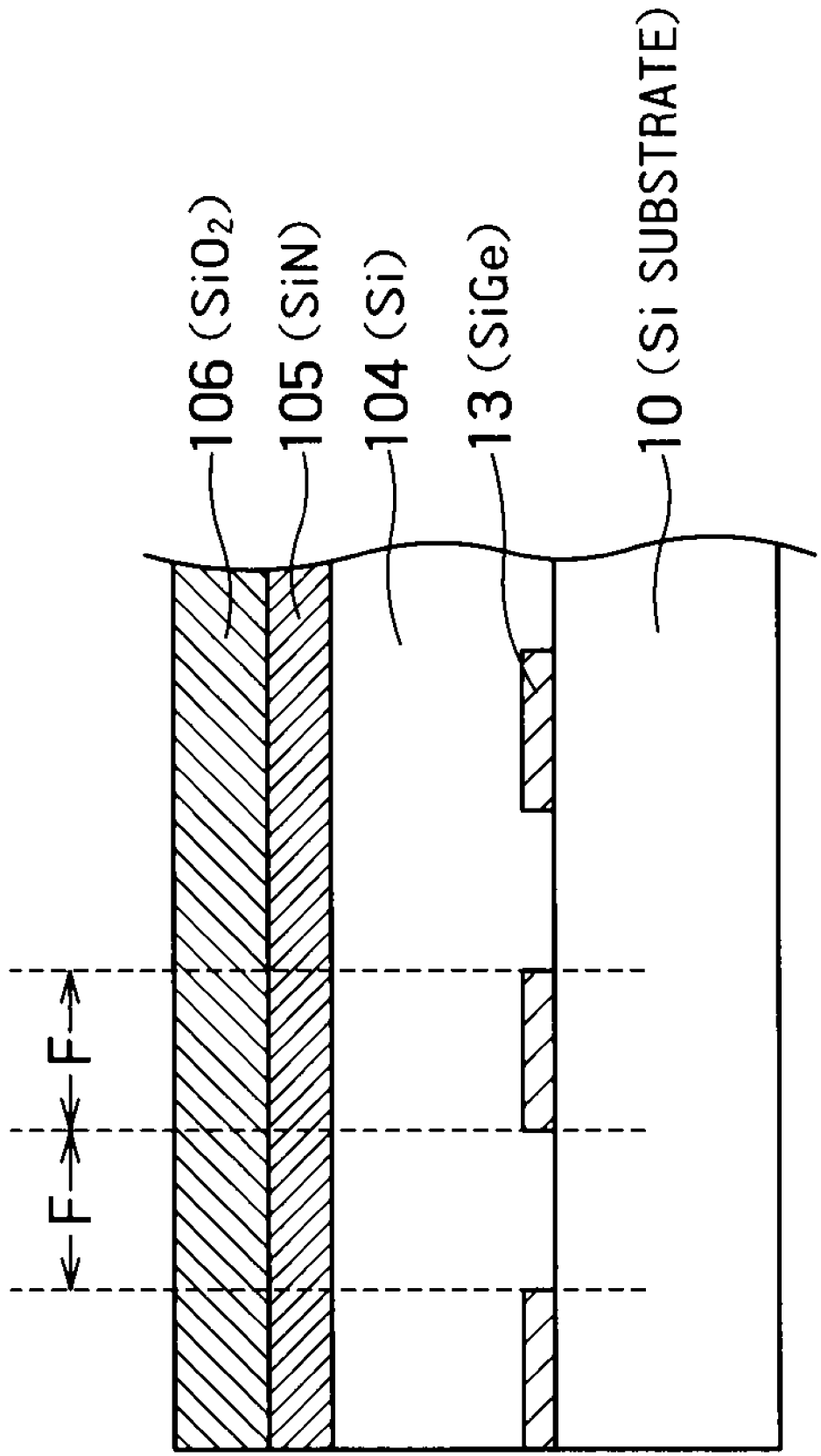
FIGS. 23 to 25 show a manufacturing method according to the second embodiment.

FIGS. 23 to 25 show a manufacturing method according to the second embodiment. First, the structure shown in FIG. 5 is formed using the bulk silicon substrate 10. The silicon oxide film 12 is removed using the ammonium fluoride solution or the like.

As shown in FIG. 23, a monocrystalline silicon layer 104 at a height of 2 F is epitaxially grown on the substrate 10 and the silicon germanium layer 13. A silicon nitride film 105 at a thickness of about 200 nm is deposited on the silicon layer 104, and a silicon oxide film 106 at a thickness of about 300 nm is deposited on the silicon nitride film 105. It is to be noted that both the silicon nitride film 105 and the silicon oxide film 106 are formed to be used as a hard mask. Accordingly, it suffices to deposit a thick silicon nitride film 105 on the silicon layer 104 without forming the silicon oxide film 106.

Figure 24B:
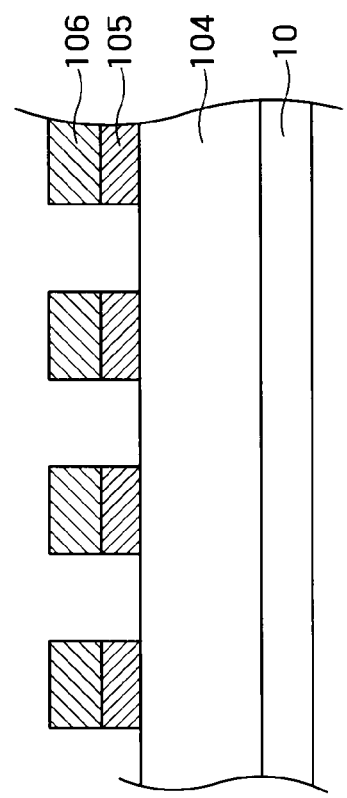
Figure 24A:
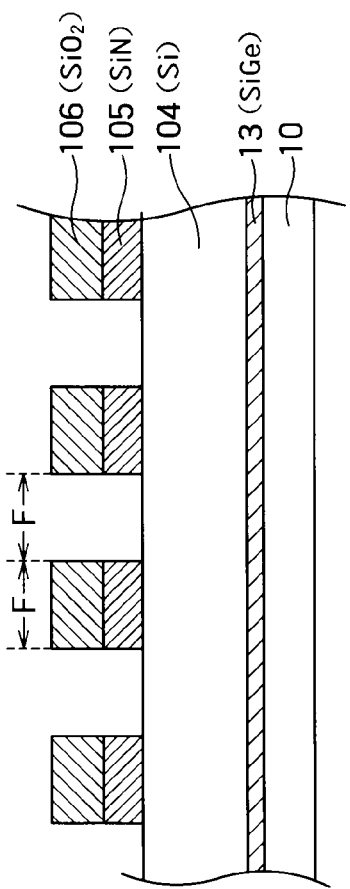

Next, as shown in FIGS. 24A and 24B, the silicon oxide film 106 and the silicon nitride film 105 are patterned into stripes by the lithography and the RIE. At this time, similarly to the silicon nitride film 15 shown in FIG. 6, the silicon oxide film 106 and the silicon nitride film 105 extend in a direction orthogonal to the extension direction of the silicon germanium layer 13. Each of line widths and space widths of the silicon oxide film 106 and the silicon nitride film 105 is F. Namely, the relationship among the silicon germanium layer 13, the silicon oxide film 106, and the silicon nitride film 105 according to the second embodiment is the same as that between the silicon germanium layer 13 and the silicon nitride film 15 according to the first embodiment. Therefore, a plane structure at this stage is similar to that shown in the plan view of FIG. 6. However, differently from the first embodiment, the silicon oxide film 106 appears on the surface in place of the silicon nitride film 15 according to the second embodiment. FIG. 24A corresponds to the cross section taken along the line 8-8 of FIG. 6, and FIG. 24B corresponds to the cross section taken along the line 9-9 of FIG. 6.

Figure 25B:
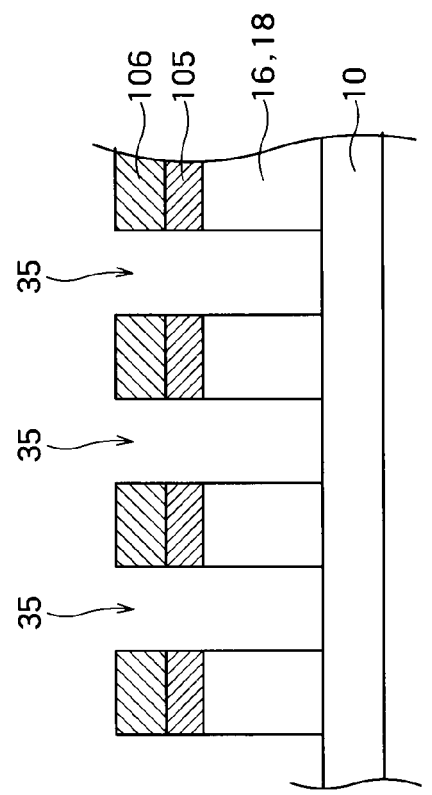
Figure 25A:
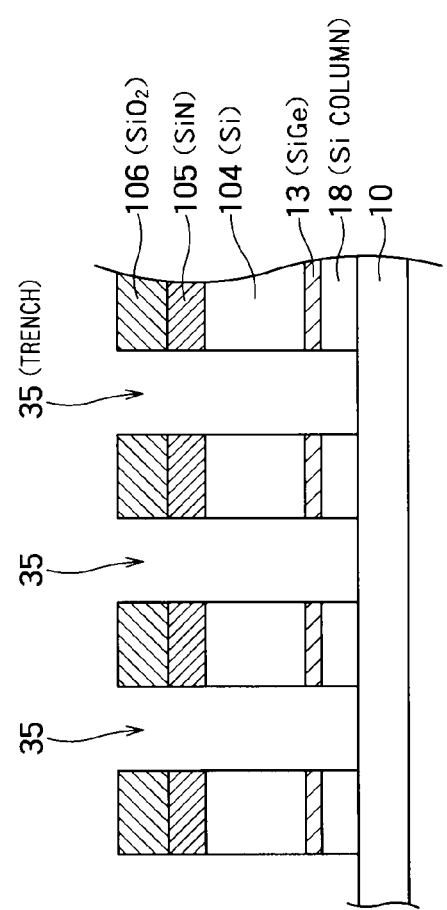

Next, as shown in FIGS. 25A and 25B, the silicon layer 104, the silicon germanium layer 13, and the silicon substrate 10 are etched by the RIE while using the silicon oxide film 106 and the silicon nitride film 105 as a mask. At this time, the silicon substrate 10 is etched in a depth of about 400 nm from the surface of the silicon substrate 10. As a result, as shown in FIGS. 25A and 25B, Fin semiconductors 16 and 18 are formed, and trenches 35 are formed to penetrate through the silicon germanium layer 13 and to reach the silicon substrate 10. The Fin semiconductors 16 and 18 extend in a direction orthogonal to the extension direction of the silicon germanium layer 13 (back gate electrodes BG) similarly to the first embodiment.

The silicon oxide film 106 is then removed, thereby obtaining the Fin semiconductor structure shown in FIGS. 14A and 14B. The monocrystalline silicon layer 104 is used as the Fin semiconductor layer 30. Thereafter, through similar manufacturing steps to those according to the first embodiment, an FBC memory device is completed. The FBC memory device according to the first embodiment can be manufactured by the same manufacturing method according to the second embodiment.

The manufacturing method according to the second embodiment requires fewer steps than those in the manufacturing method according to the first embodiment to manufacture the FBC memory device. In the second embodiment, the monocrystalline silicon layer 104 is epitaxially grown on entire surfaces of the substrate 10 and the silicon germanium layer 13 as shown in FIG. 23. Due to this, there is no need to perform the selective epitaxial growth in the second embodiment. The second embodiment further provides the same effect as that of the first embodiment.

In the above embodiments, the silicon germanium layer 13 is employed to form the through openings 40. The silicon germanium layer can be replaced by a silicon oxide film or a silicon nitride film. In this alternative, polysilicon is grown on the silicon oxide film or silicon nitride film at epitaxial growth of monocrystalline silicon. The polysilicon can be monocrystallized by thermal treatment. Alternatively, monocrystallization of the polysilicon can be realized by such a method as an electron beam recrystallization method.

Third Embodiment

Figure 26:
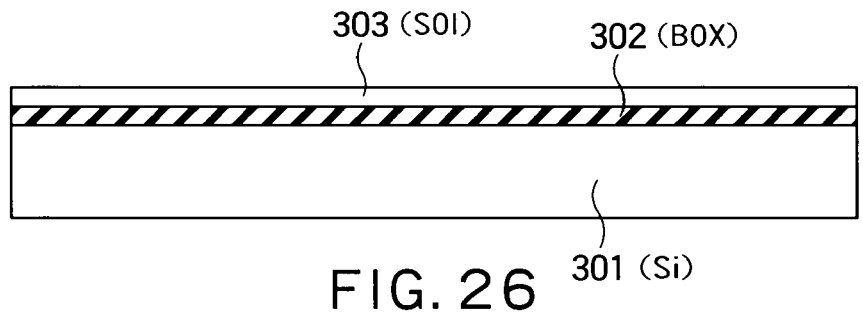

As shown in FIG. 26, an SOI substrate including a silicon substrate 301, a BOX layer 302, and an SOI layer 303 made of monocrystalline silicon is prepared. The silicon substrate 301 is made of p monocrystalline silicon at an impurity concentration of $1 \times 10^{14}$ cm$^{-3}$. The SOI layer 303 serving as an active layer is made of p monocrystalline silicon at an impurity concentration of $1 \times 10^{16}$ to $1 \times 10^{17}$ cm$^{-3}$. The SOI layer 303 can be used as an nMIS channel region as it is.

Figure 27:
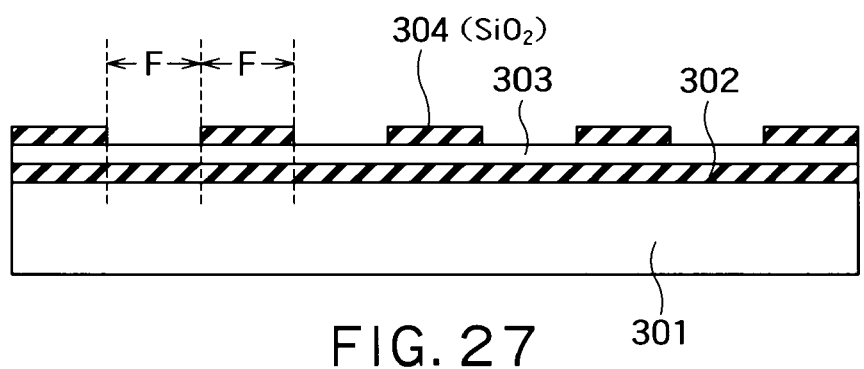

A silicon oxide film 304 at a thickness of about 50 nm is deposited on the silicon substrate 301. As shown in FIG. 27, the silicon oxide film 304 on a surface of the silicon substrate 301 in a surface region, in which back gate electrodes BG are to be formed, is removed by lithography and RIE. At this time, the silicon oxide film 304 is formed into stripes with each of a line width and a space width set to F.

Figure 28:
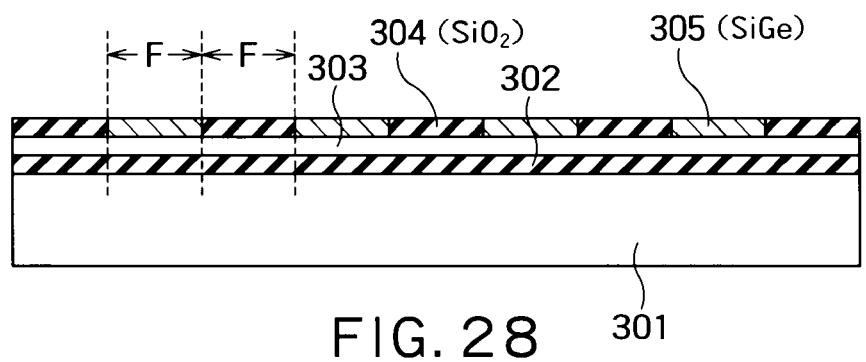

As shown in FIG. 28, a monocrystalline silicon germanium layer 305 at a thickness of about 50 nm is epitaxially grown in the exposed surface region of the silicon substrate 301.

Figure 29:
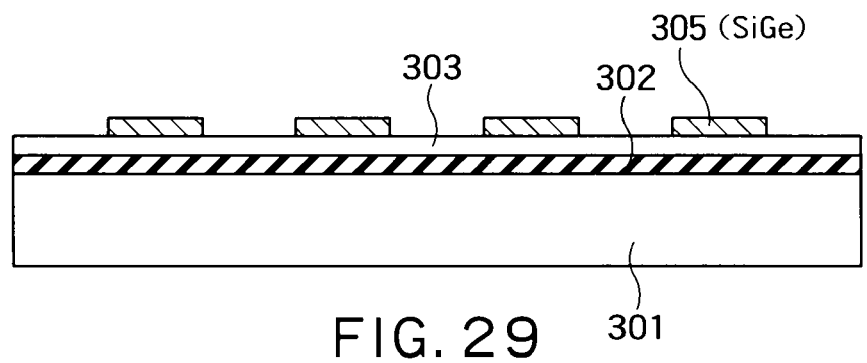

As shown in FIG. 29, the rest of the silicon oxide film 304 is removed using an ammonium fluoride solution.

Figure 30A:
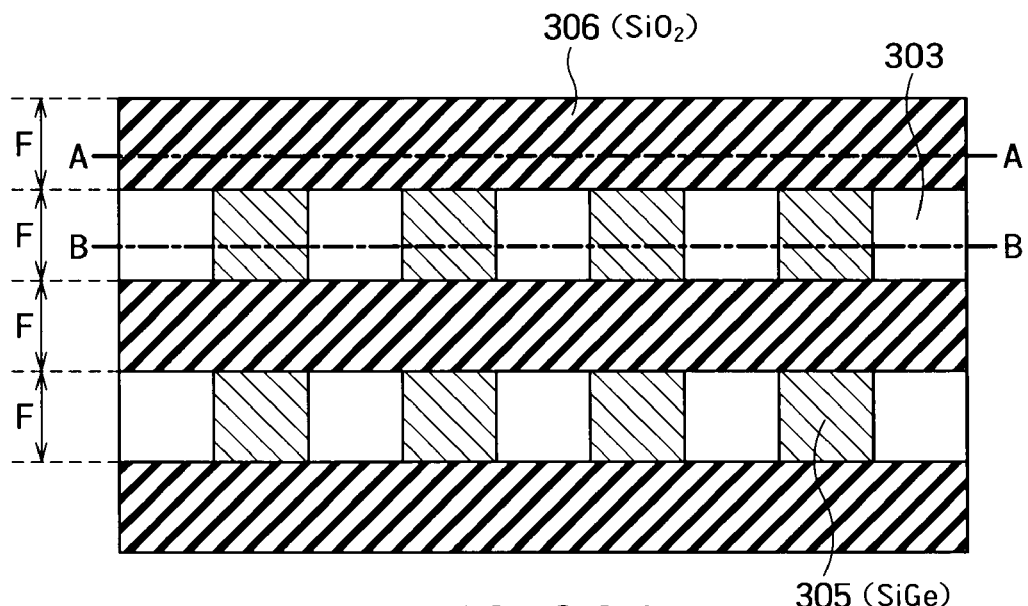
Figure 30B:
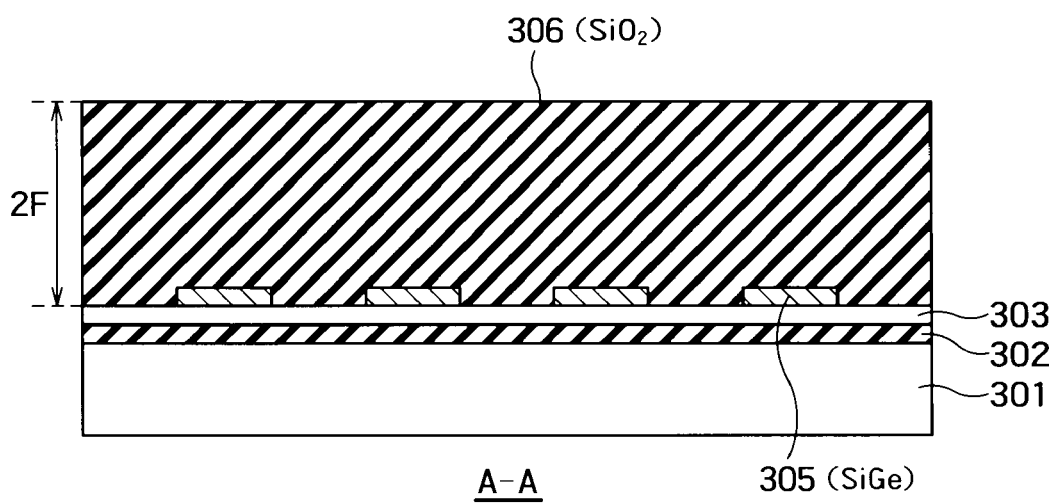
Figure 30C:
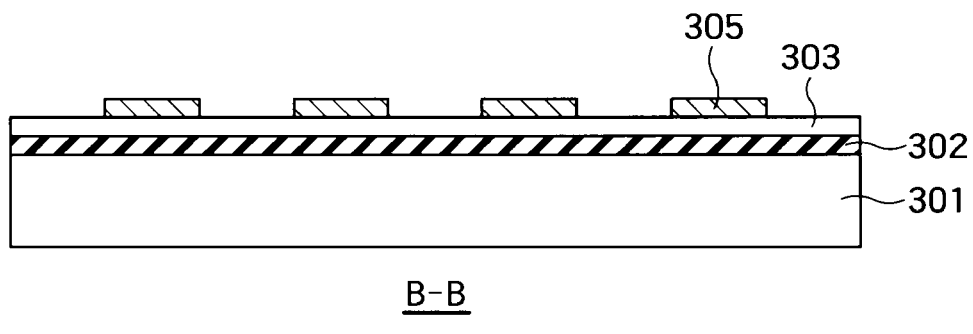

As shown in FIG. 30B, a silicon oxide film 306 at a height of about 2 F is deposited on a structure shown in FIG. 29. Next, as shown in a plan view of FIG. 30A, the silicon oxide film 306 is worked into stripes by lithography and RIE. An extension direction of the silicon oxide film 306 at this time is orthogonal to an extension direction of the silicon germanium layer 305. Each of a line width and a space width of the silicon oxide film 306 is F. FIGS. 30B, 31B, 32B, 33B, 34B, 35B, and 36B are cross-sectional view taken along lines A-A of FIGS. 30A, 31A, 32A, 33A, 34A, 35A, and 36A, respectively. FIGS. 30C, 31C, 32C, 33C, 34C, 35C, and 36C are cross-sectional view taken along lines B-B of FIGS. 30A, 31A, 32A, 33A, 34A, 35A, and 36A, respectively.

Figure 31A:
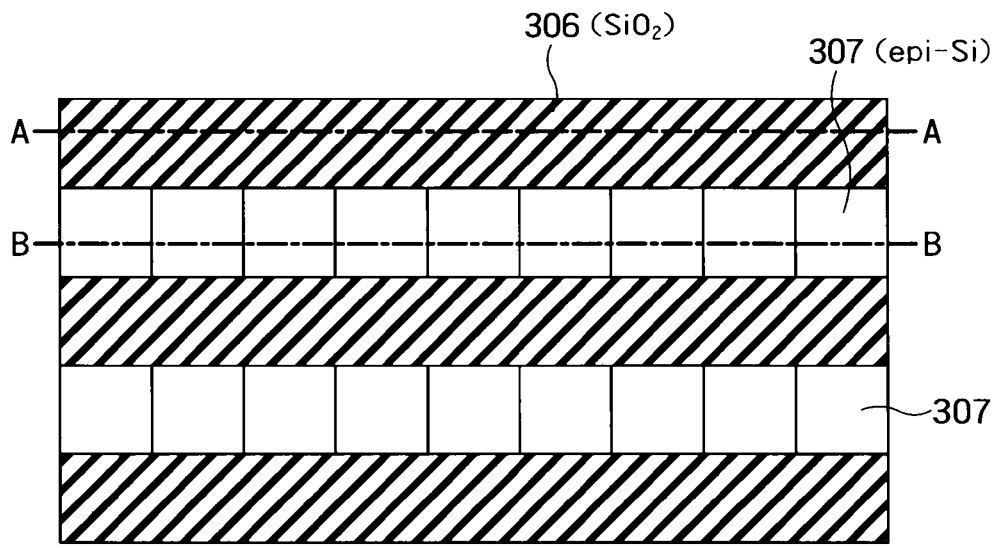
Figure 31B:
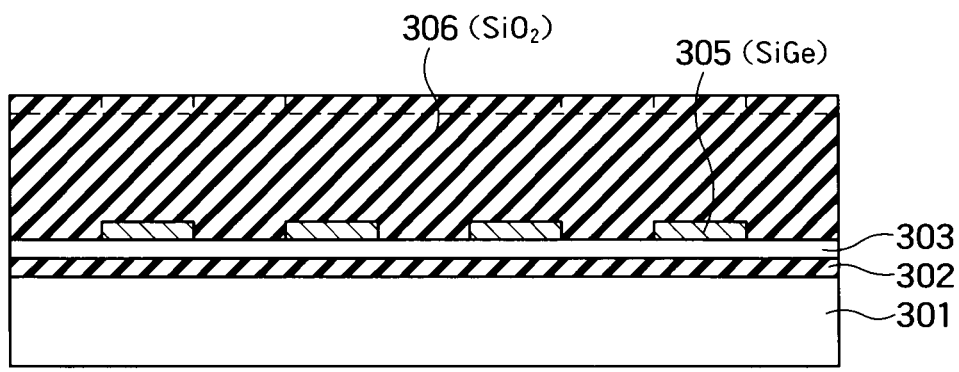
Figure 31C:
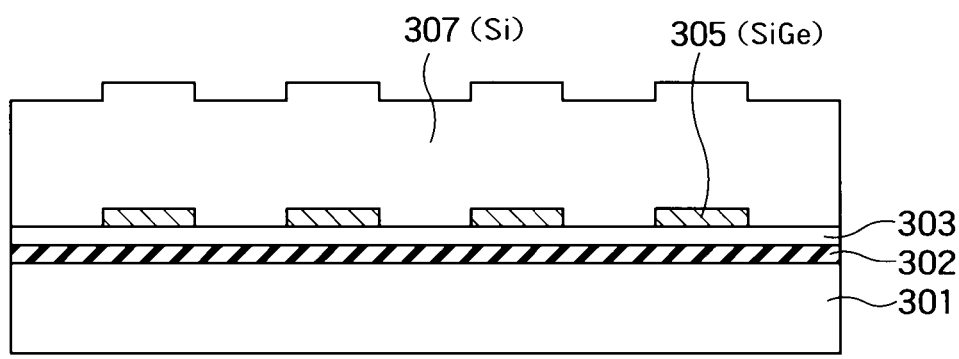

As shown in FIGS. 31A and 31C, a monocrystalline silicon layer 307 is selectively and epitaxially grown only on the exposed SOI layer 303 and the silicon germanium layer 305. As a result, a cross-sectional structure shown in FIG. 31C is obtained. As shown in FIG. 31C, the monocrystalline silicon layer 307 is formed to reflect a height difference between the silicon germanium layer 305 and the SOI layer 303 formed under the monocrystalline silicon layer 307 as it is. The monocrystalline silicon layer 307 is set to be equal to or higher than an upper surface of the silicon oxide film 306. To this end, therefore, the monocrystalline silicon layer 307 is grown up to a higher position than that of the silicon oxide film 306. Thereafter, the monocrystalline silicon layer 307 is polished up to a height level of the upper surface of the silicon oxide film 306 by CMP.

Figure 32A:
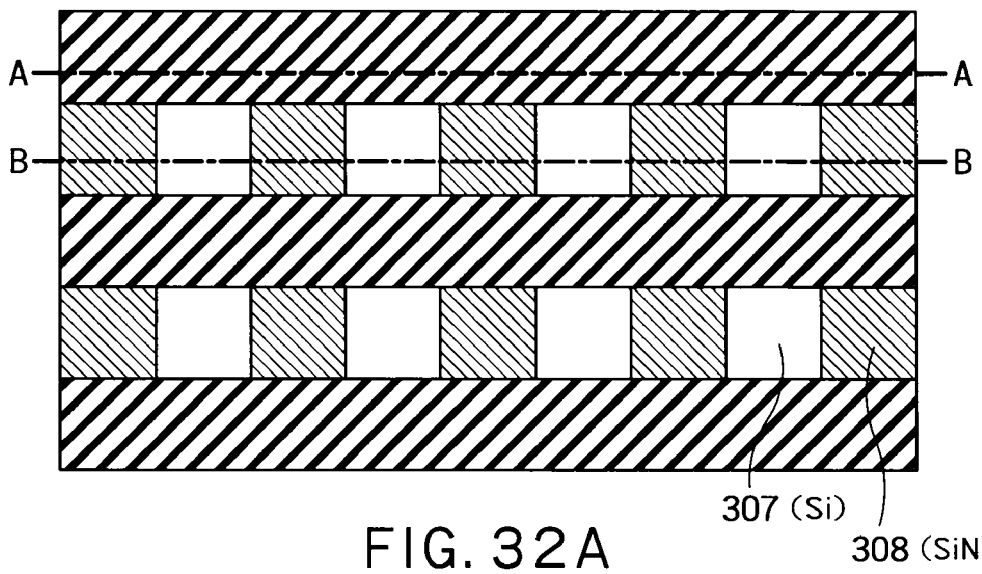
Figure 32B:
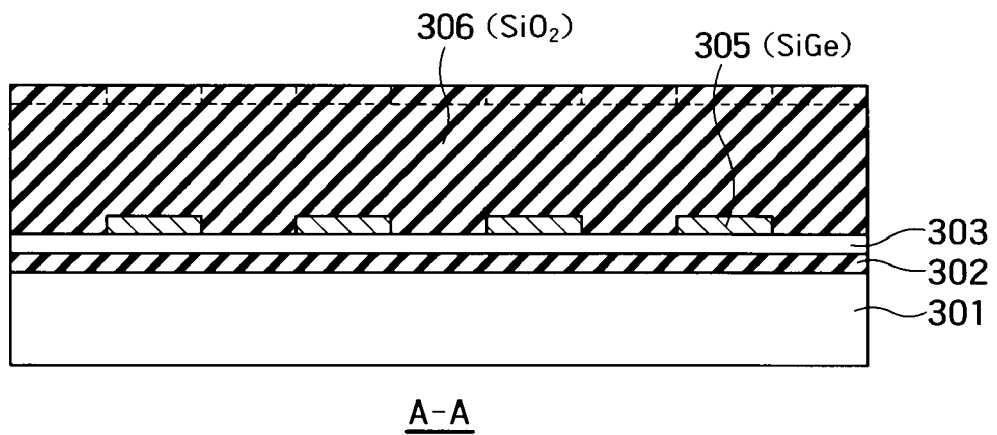
Figure 32C:
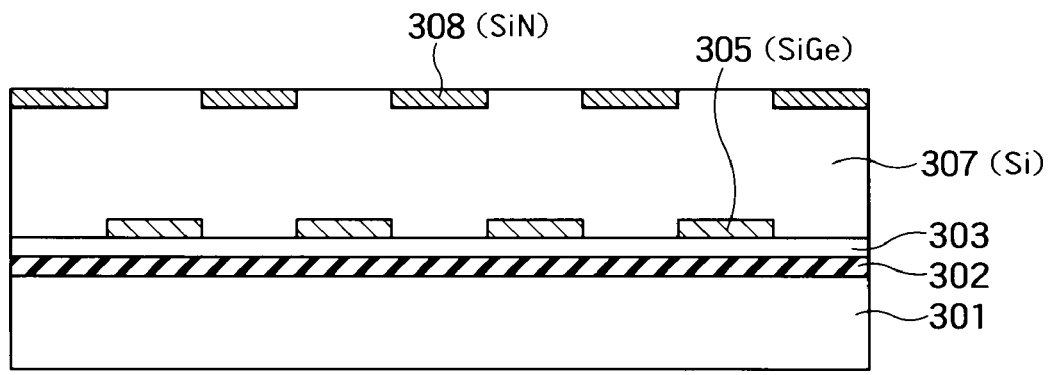

A silicon nitride film 308 is deposited on the silicon oxide film 306 and the monocrystalline silicon layer 307. By etching back the silicon nitride film 308 by CMP, the silicon nitride film 308 is selectively left in convex portions of the monocrystalline silicon layer 307 as shown in FIGS. 32A and 32C. As a result, as shown in FIG. 32C, only the monocrystalline silicon layer 307 is present on the silicon germanium layer 305 whereas not only the monocrystalline silicon layer 307 but also the silicon nitride film 308 is present on the SOI layer 303 among parts of the adjacent silicon germanium layer 305.

Figure 33A:
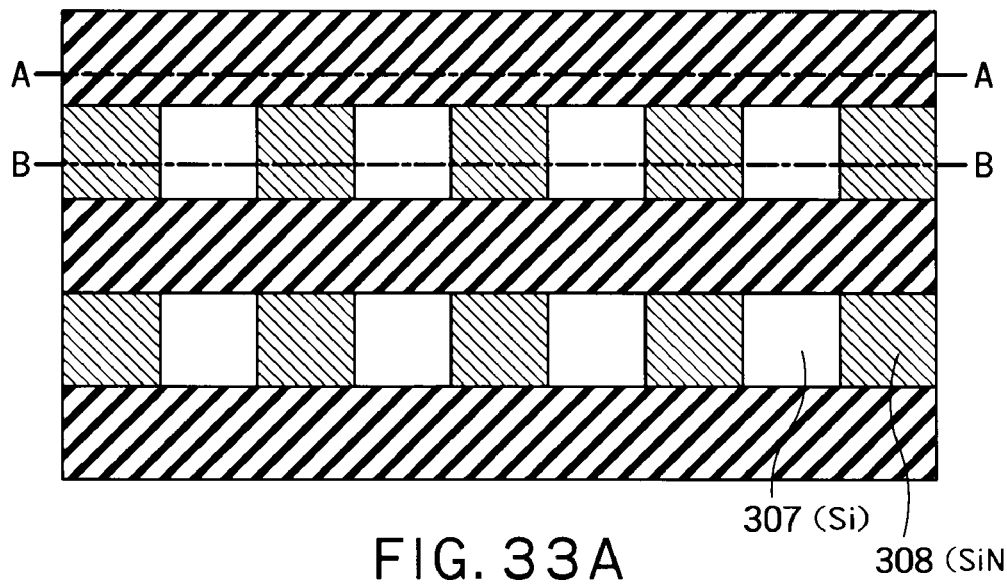
Figure 33B:
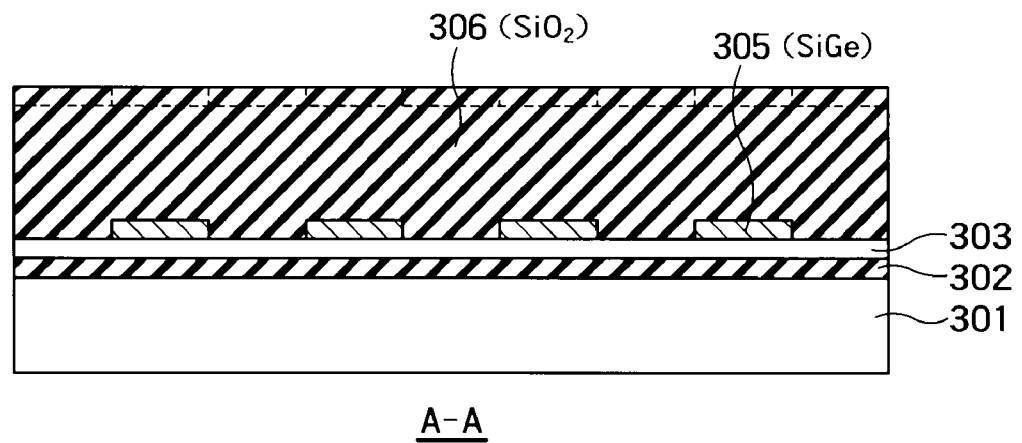
Figure 33C:
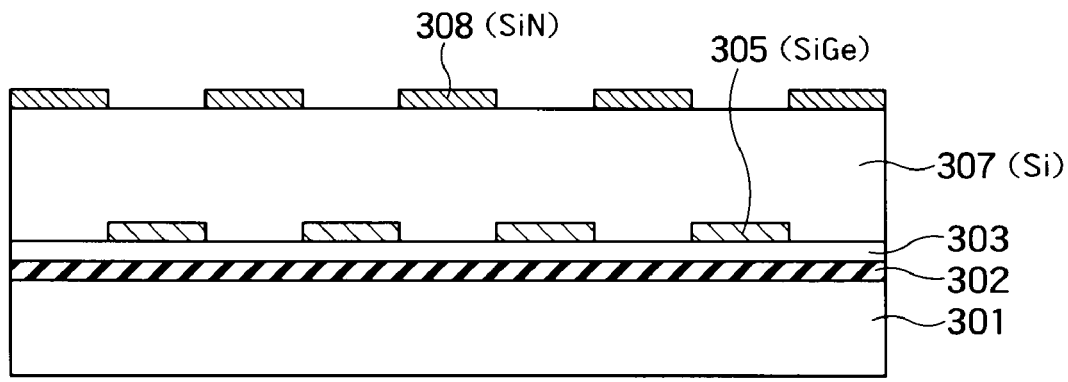

The exposed monocrystalline silicon layer 307 is selectively etched to have almost the same thickness as that of the silicon nitride film 308 by RIE. As a result, as shown in FIG. 33C, an upper surface of the monocrystalline silicon layer 307 is almost flat and the silicon nitride film 308 protrudes on the monocrystalline silicon layer 307 as convex portions.

Figure 34A:
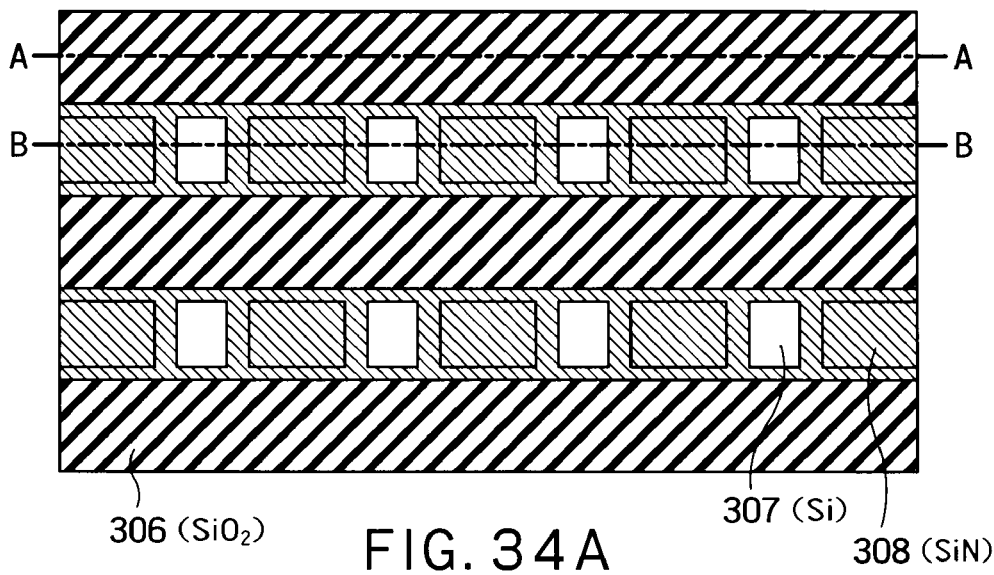
Figure 34B:
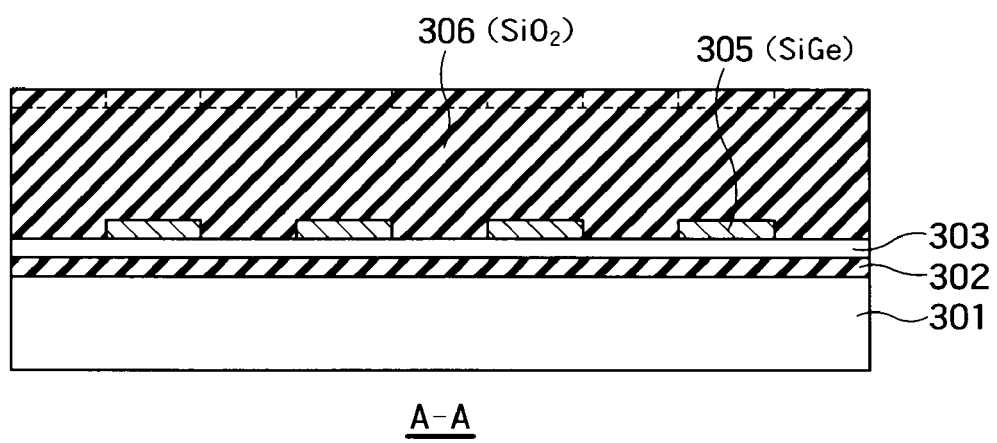
Figure 34C:
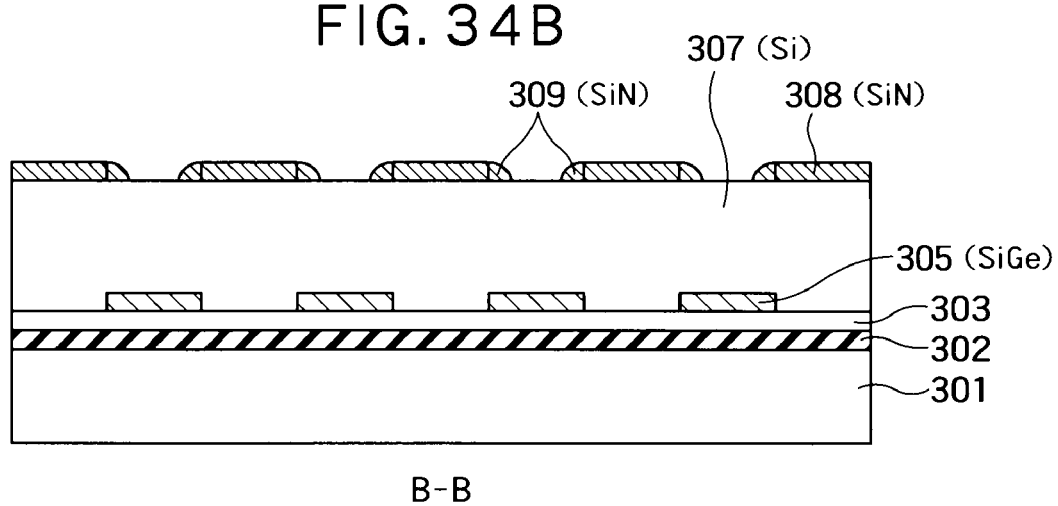

A silicon nitride film 309 at a thickness of about 50 nm is deposited on the monocrystalline silicon layer 307, the silicon oxide film 306, and the silicon nitride film 308. The silicon nitride film 309 is anisotropically etched by RIE, thereby leaving the silicon nitride film 309 on side-surfaces of the silicon nitride film 308 as sidewalls. As a result, a cross-sectional structure shown in FIG. 34C is obtained.

Figure 35A:
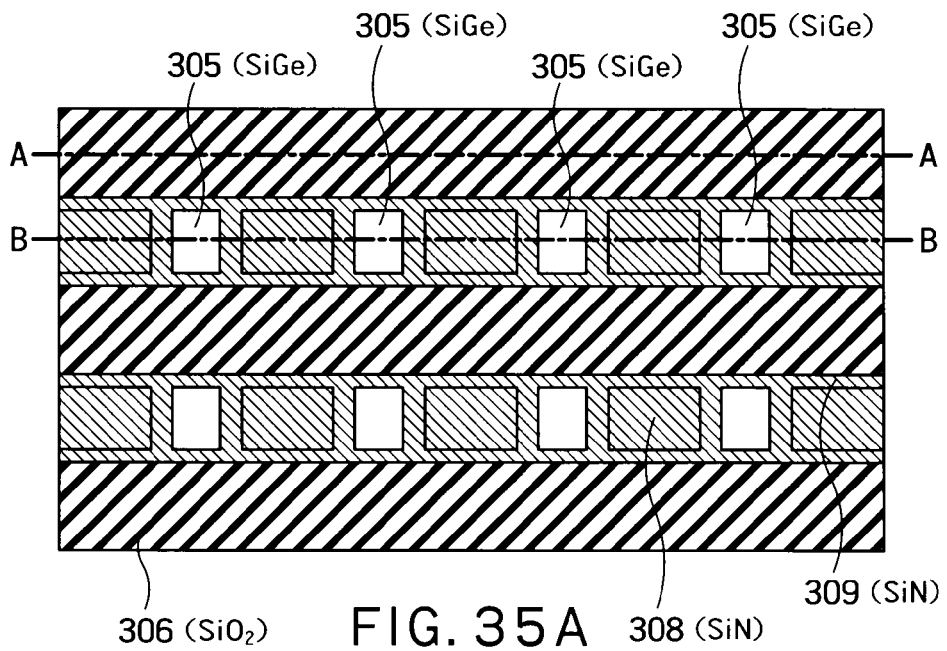
Figure 35B:
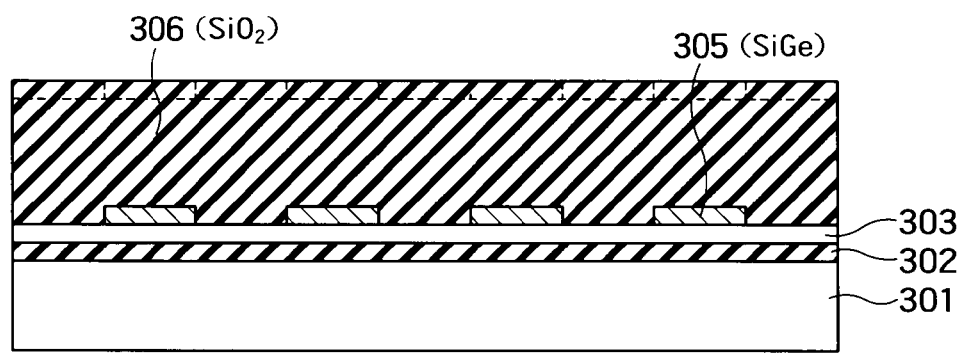
Figure 35C:
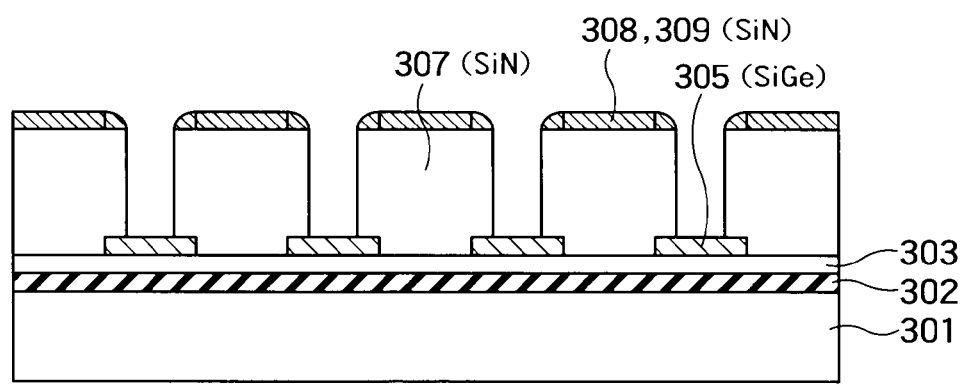

Using the silicon nitride films 308 and 309 as a mask, the monocrystalline silicon layer 307 is anisotropically etched by RIE until the silicon germanium layer 305 is exposed. As a result, a cross-sectional structure shown in FIG. 35C is obtained. At this time, the monocrystalline silicon layer 307 is formed into lines and spaces (stripes) to as Fin semiconductors. Bodies B, source layers S, and drain layers D are formed in the Fin semiconductors, respectively.

Figure 36A:
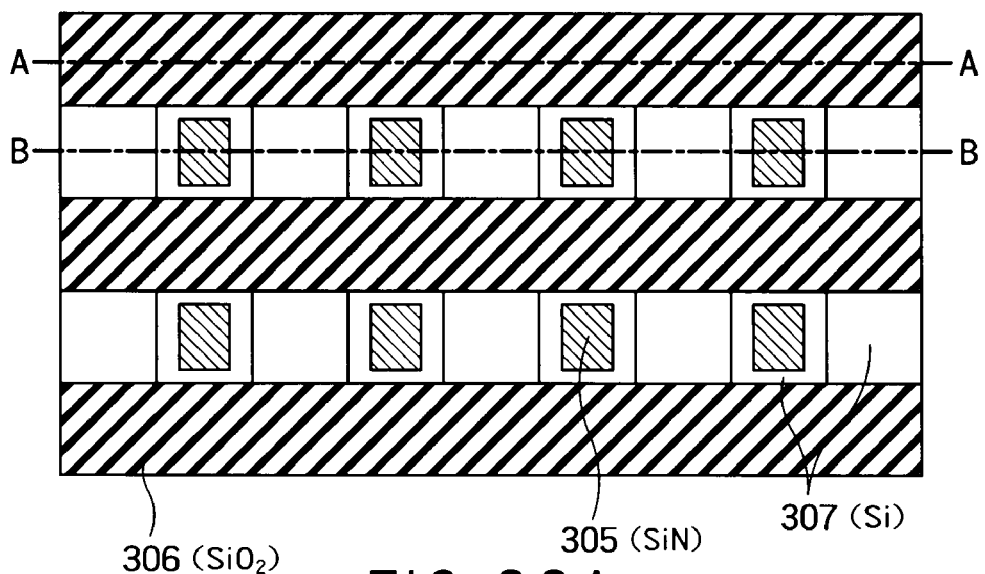
Figure 36B:
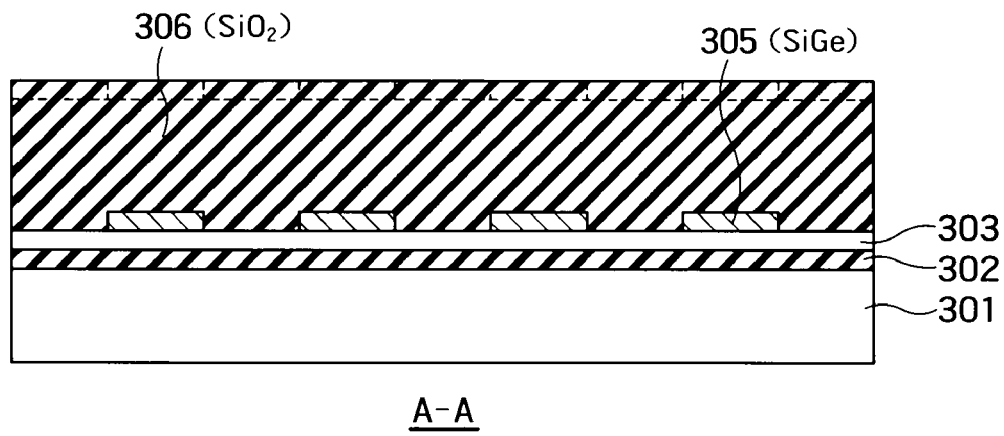
Figure 36C:
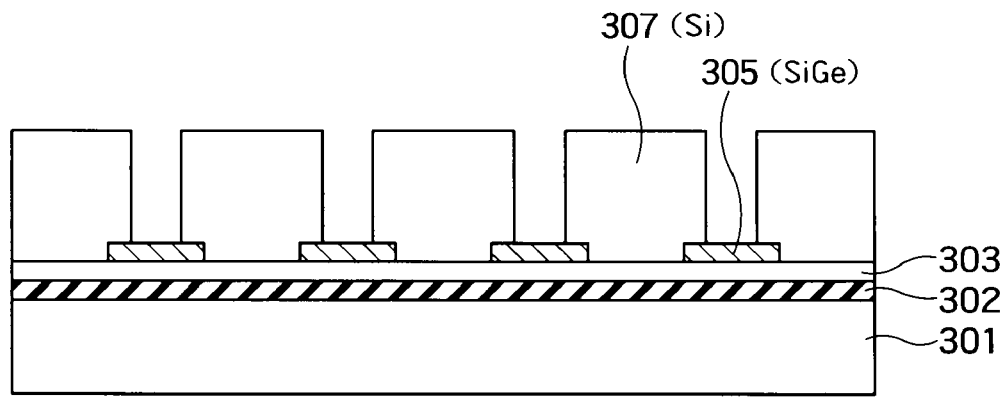

The silicon nitride films 308 and 309 are removed using a hot phosphoric acid solution. As a result, a structure shown in FIGS. 36A to 36C is obtained.

Figure 37A:
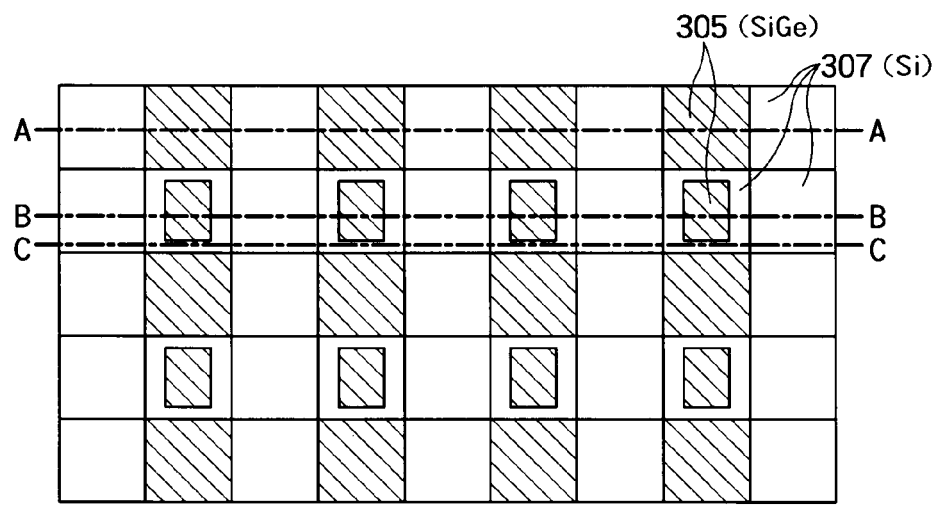
Figure 37B:
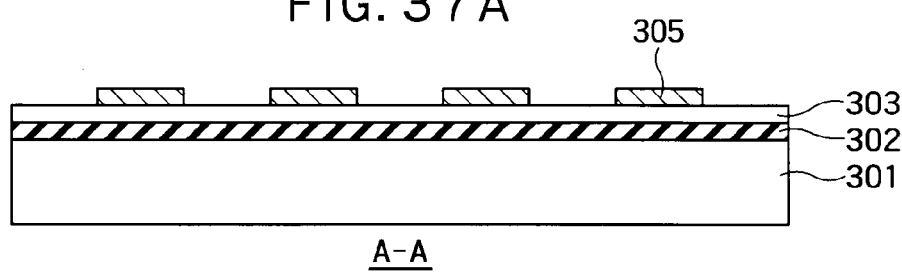
Figure 37C:
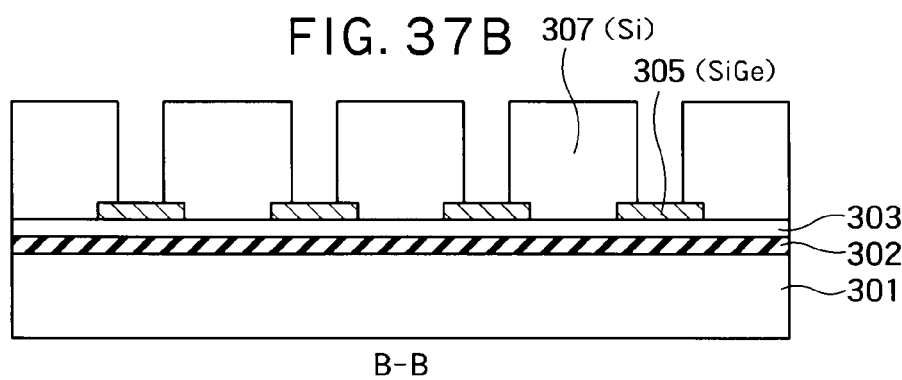
Figure 37D:
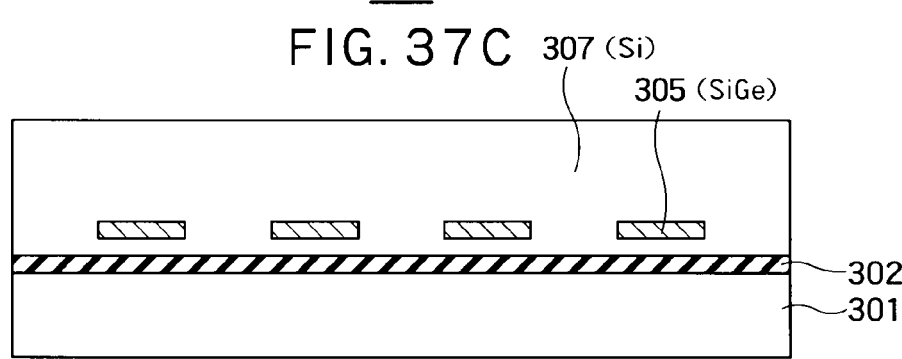

As shown in FIGS. 37A to 37D, the silicon oxide film 306 is removed using an ammonium fluoride solution. FIGS. 37B to 37D are cross-sectional views taken along lines A-A, B-B, and C-C of FIG. 37A, respectively.

Figure 38A:
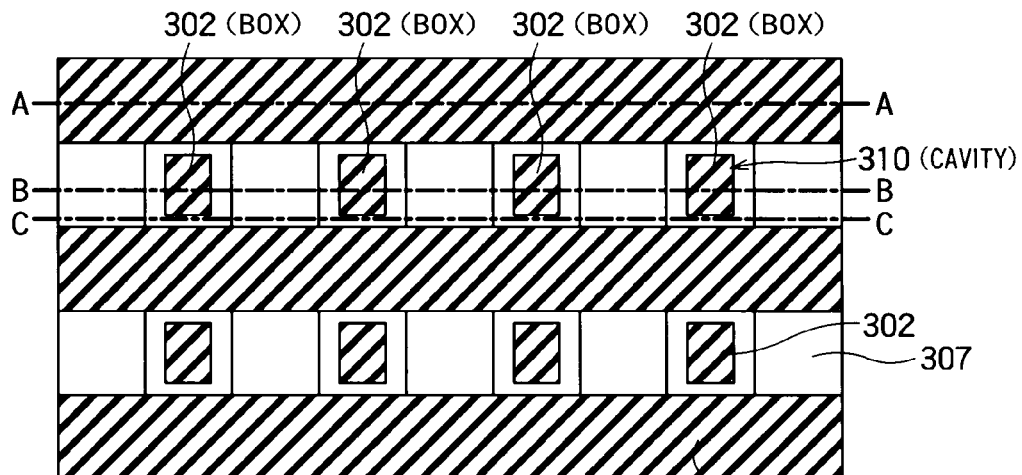
Figure 38B:
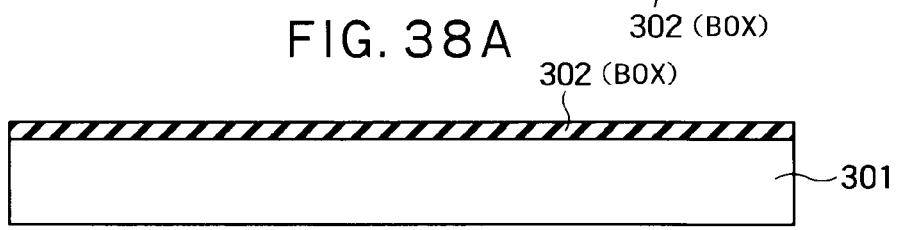
Figure 38C:
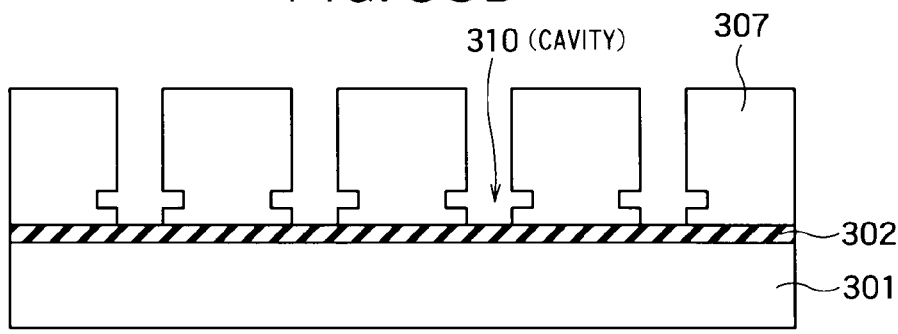
Figure 38D:
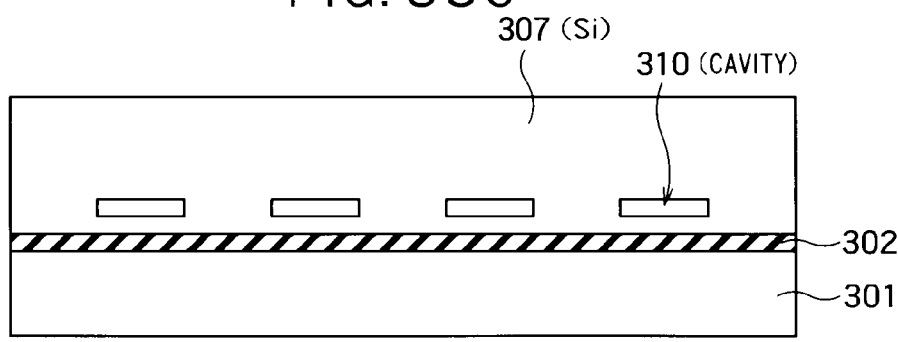

As shown in FIGS. 38A to 38D, the silicon germanium layer 305 is removed using a mixture solution of hydrofluoric acid and acetic acid. Since the silicon germanium layer 305 is exposed on side surfaces of the monocrystalline silicon layer 307, the silicon germanium layer 305 is etched from the exposed portions. As a result, cavities 310 are formed in the monocrystalline silicon layer 307. Furthermore, the SOI layer 303 is anisotropically etched by RIE. At this time, the monocrystalline silicon layer 307 is simultaneously etched with the SOI layer 303. However, etching of the monocrystalline silicon layer 307 is negligible since the SOI layer 303 is far thinner than the monocrystalline silicon layer 307. By etching the SOI layer 303, the cavities 310 reach the BOX layer 302 to expose the BOX layer 302 as shown in FIGS. 38A and 38C.

Figure 39:
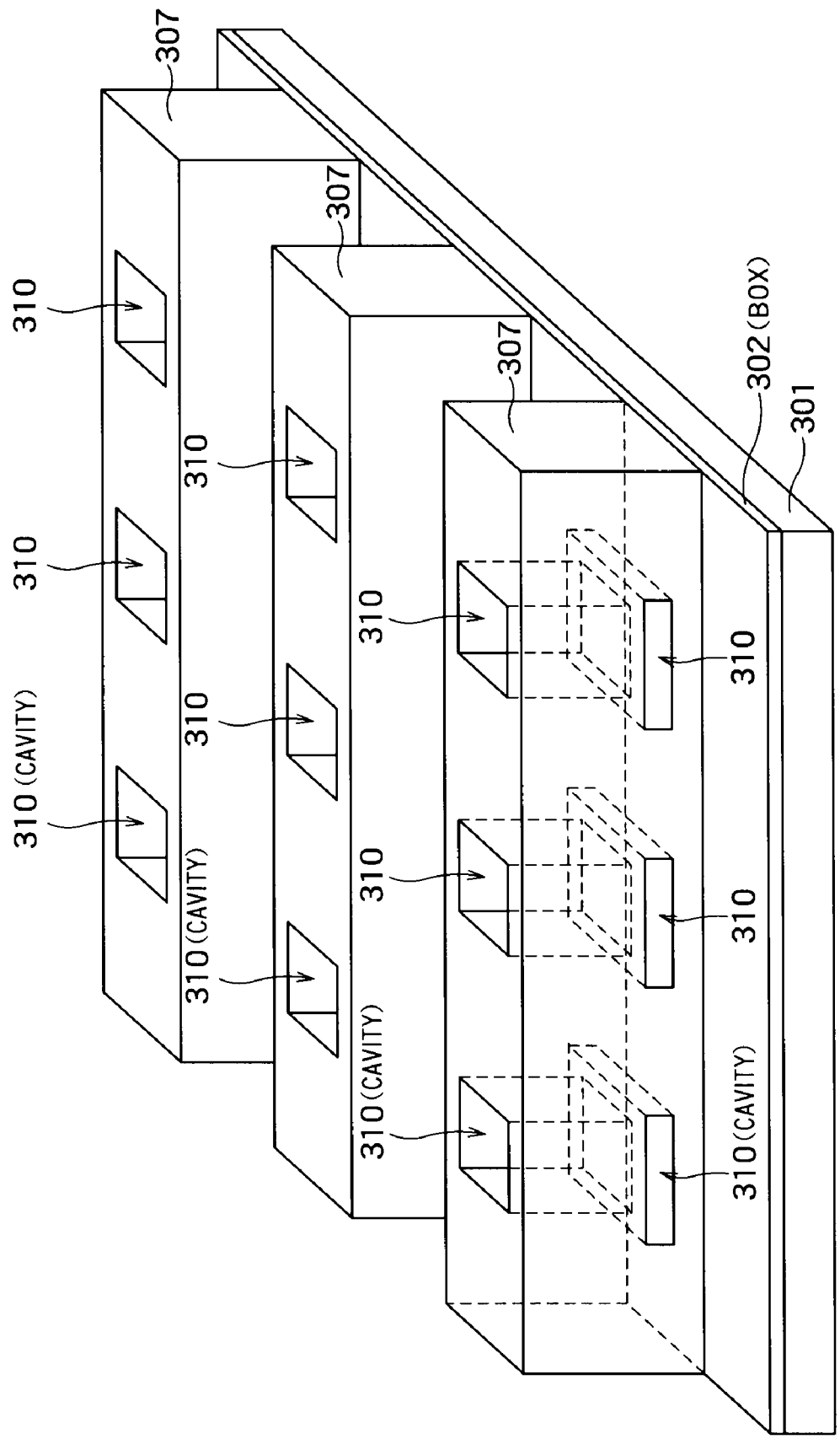

FIG. 39 is a bird's-eye view showing a structure at this stage. The cavities 310 range from the upper surface of the monocrystalline silicon layer 307 to the BOX layer 302 and are open in a direction almost orthogonal to an extension direction of the monocrystalline silicon layer 307 on the side surfaces of the monocrystalline silicon layer 307. Namely, each of the cavities 310 includes not only a through opening penetrating from the upper surface of the monocrystalline silicon layer 307 to a bottom thereof but also a through opening penetrating from one of the side surfaces of the monocrystalline silicon layer 307 to the opposite side surface thereof.

Figure 40A:
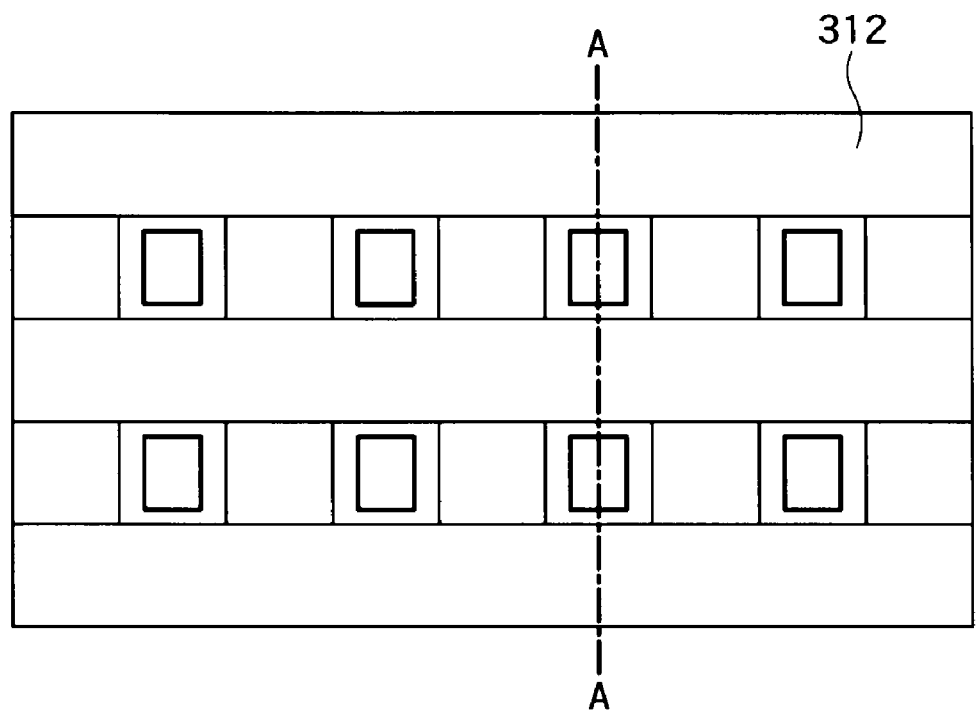
Figure 40B:
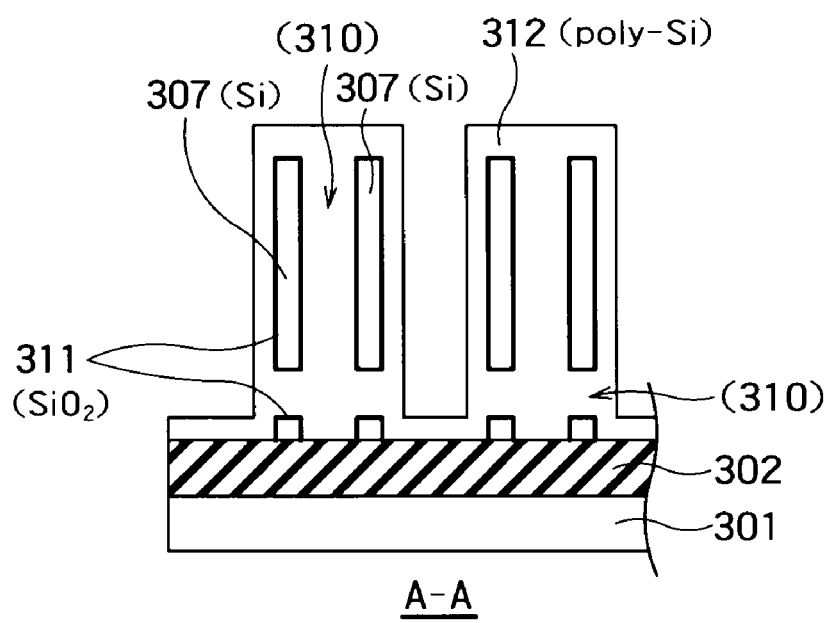
Figure 41A:
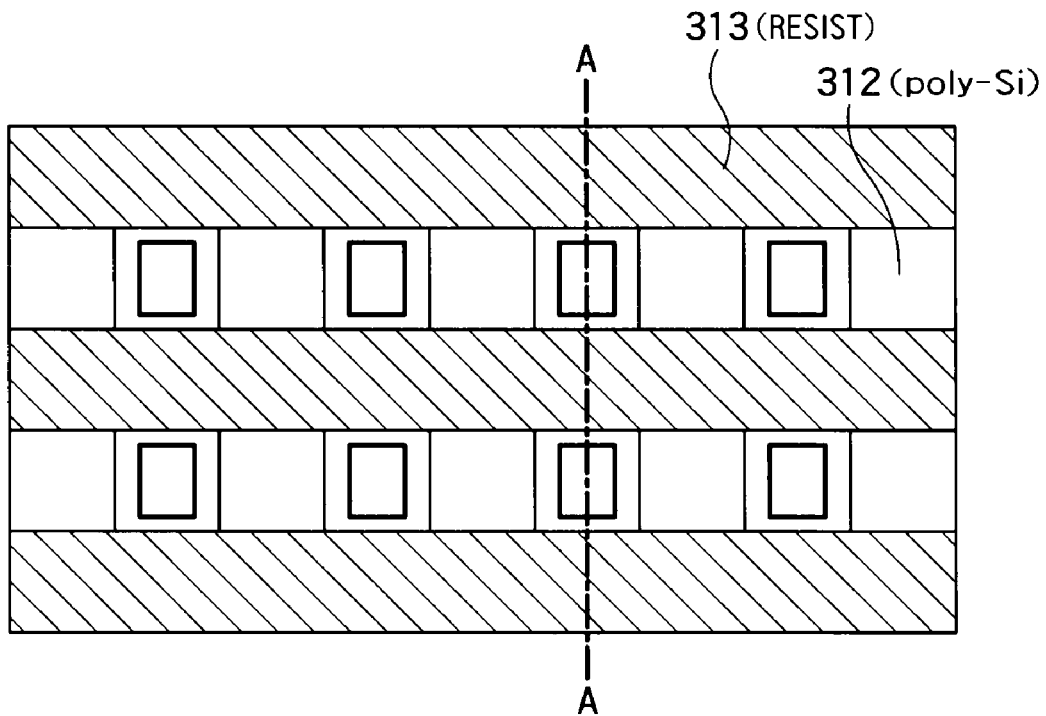
Figure 41B:
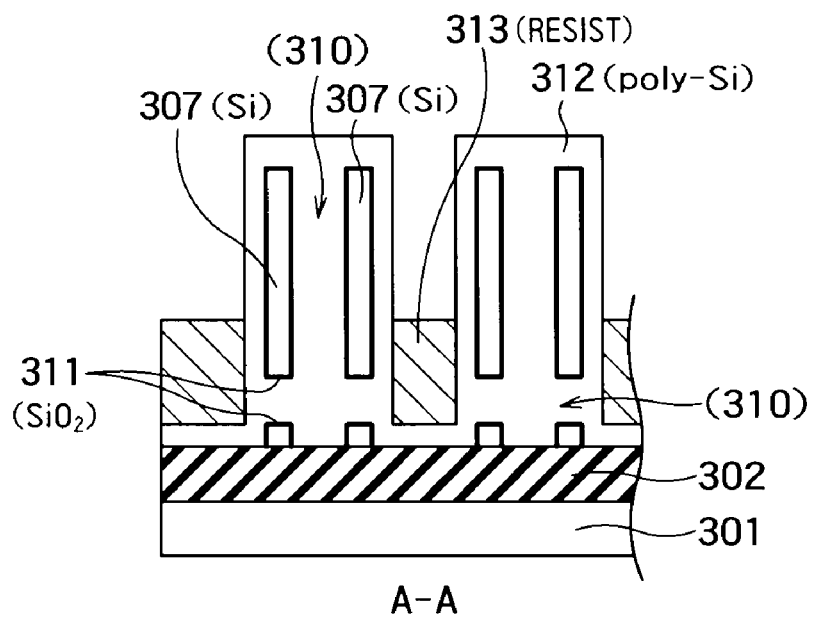
Figure 42A:
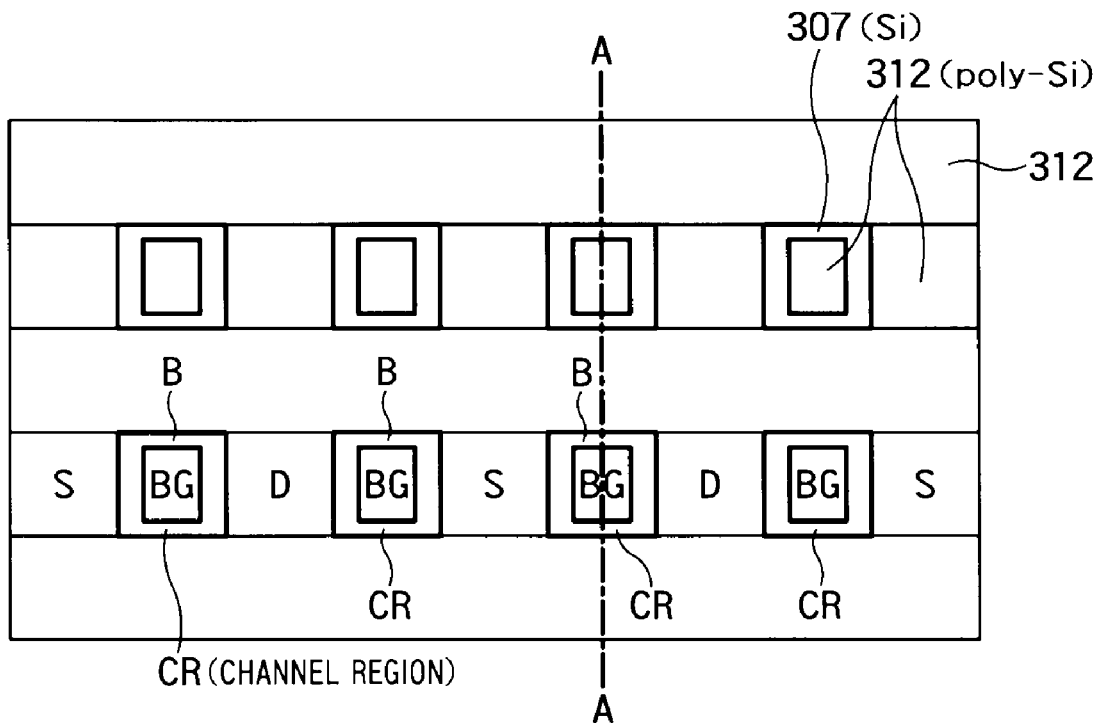
Figure 42B:
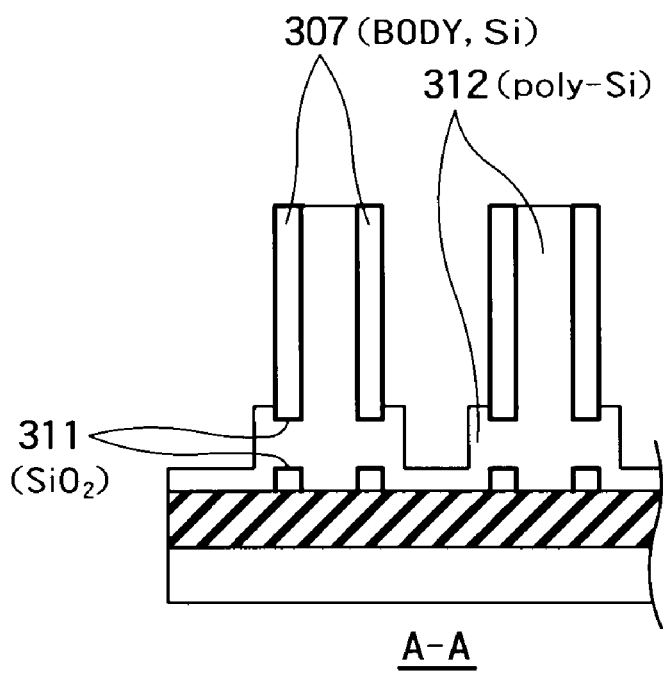

As shown in FIG. 40B, an insulating film 311 at a thickness of about 5 nm is formed on the surface of the monocrystalline silicon layer 307 by thermal oxidation. At this time, the insulating film 311 is also formed on the surface of the monocrystalline silicon layer 307 on an inside surface of each of the cavities 310 as a first gate insulating film. FIGS. 40B, 41B, and 42B are cross-sectional views taken along lines A-A of FIGS. 40A, 41A, and 42A, respectively.

Further, as shown in FIGS. 40A and 40B, doped polysilicon 312 that become back gate electrodes is deposited by about 50 nm. The polysilicon 312 is heavily doped with phosphorus. At this time, as shown in FIG. 40B, the cavities 310 are buried.

A resist 313 is applied onto the polysilicon 312 and then etched back. At this time, the resist 313 is etched back so that an upper surface of the resist 313 is higher in position than an upper end of the through opening of each of the cavities 310 provided to penetrate through the side surfaces of the monocrystalline silicon layer 307.

Figure 43:
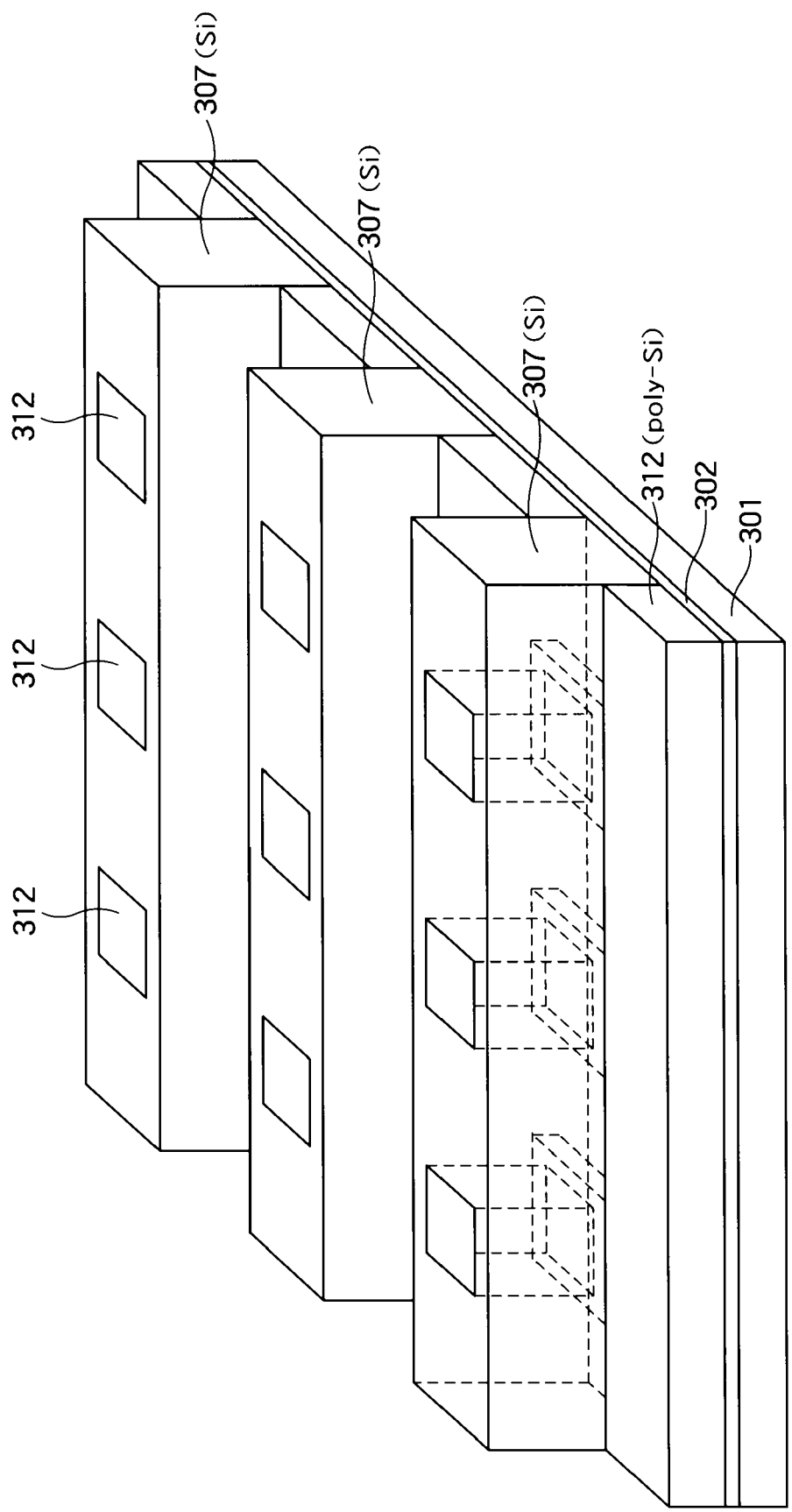

Using the resist 313 as a mask, the polysilicon 312 is isotropically etched by isotropic plasma etching (CDE). Thereafter, the resist 313 is removed, thereby obtaining a structure shown in FIGS. 42A and 42B. As shown in FIG. 42A, the monocrystalline silicon layer 307 that become bodies B and a channel region CR is formed to surround the polysilicon layer 312 that become back gates BG in a plan view. The channel region CR is formed between the source S and the drain D. As shown in FIG. 42B, each of the back gates BG (the polysilicon layer 312) includes a tubular portion surrounded by each body B (the monocrystalline silicon layer 307) in a cross-sectional view. FIG. 43 is a bird's-eye view showing a structure at this stage.

Next, second thermal oxidation is carried out to form a second gate insulating film 314 at a thickness of about 5 nm on a surface of the polysilicon 312 as shown in FIG. 44B. As shown in FIGS. 44B and 44C, doped polysilicon 315 that become front gate electrodes FG is deposited on the structure by about 50 nm. The polysilicon 315 is heavily doped with phosphorus. Further, the polysilicon 315 as well as the polysilicon 312 is anisotropically etched into lines and spaces (stripes) by lithography and RIE. At this time, a width of each of the polysilicon 315 and the polysilicon 312 is almost equal to F and the polysilicon 315 and the polysilicon 312 extend in a direction almost orthogonal to the extension direction of the monocrystalline silicon layer 307 (bodies B, source layers S, and drain layers D). As shown in FIG. 44C, the polysilicon 315 is superimposed on the polysilicon 312. The second gate insulating film 314 not only acts as a gate insulating film but also acts to isolate the polysilicon 315 superimposed on the polysilicon 312 from the polysilicon 312.

Next, using the polysilicon 315 to serve as the front gate electrodes BG as a mask, n impurity ions are implanted into the source and drain regions of the monocrystalline silicon layer 307. Thereafter, high temperature annealing is carried out at 1000° C. or higher, thereby activating impurities in the diffused layer of the source and drain regions.

Figure 45:
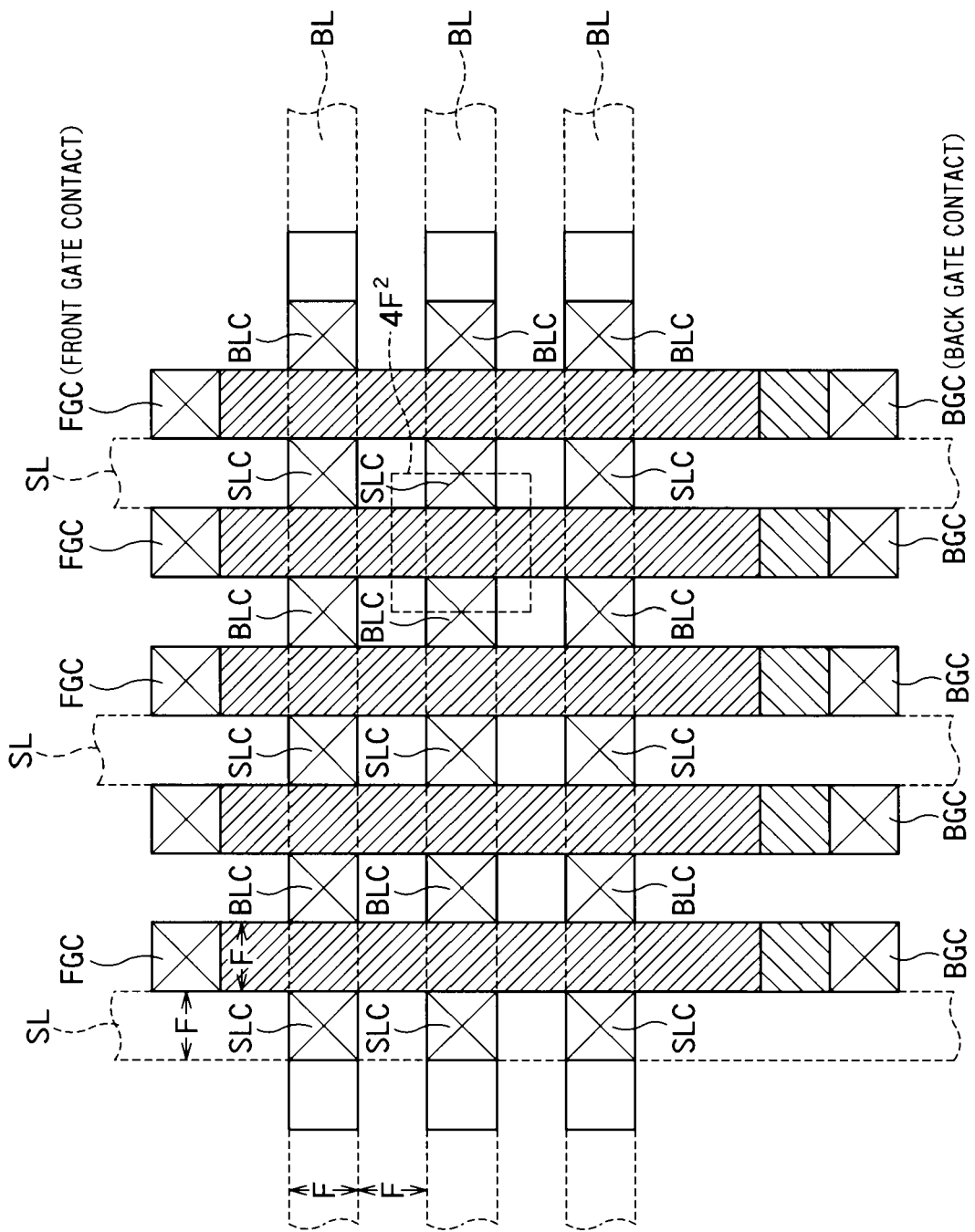

An interlayer insulating film 315 is then deposited on the monocrystalline silicon layer 307 and the BOX layer 302 by LPCVD (Low Pressure CVD). Thereafter, contacts corresponding to the respective electrodes are formed. At this time, as shown in FIG. 45, front gate contacts FGC are connected to the polysilicon 315 pulled in a perpendicular direction to the extension direction of the monocrystalline silicon layer 307. Back gate contacts BGC are connected to the polysilicon 312 pulled in the perpendicular direction to the extension direction of the monocrystalline silicon layer 307 and to an opposite side to the front gate contacts FGC.

Figure 46:
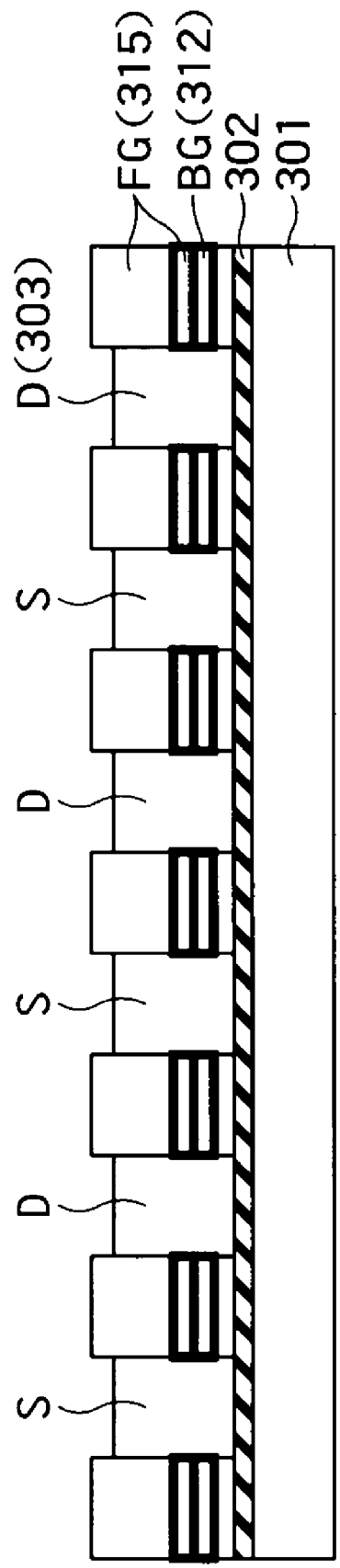

Bit lines BL extend almost in parallel to the extension direction of the monocrystalline silicon layer 307, and bit line contacts BLC are connected to the drain layers D formed in the polycrystalline silicon layer 307. Source line contacts SLC are connected to the source layers S formed in the polycrystalline silicon layer 307. FIG. 46 is a cross-sectional view taken along a line A-A of FIG. 45.

In the third embodiment, each back gate electrode BG (polysilicon 312) is formed into a columnar shape to penetrate through the polycrystalline silicon layer 307. Each body B is formed to surround the back gate electrode BG. Due to this, an opposing area between the body B and the back gate electrode BG is quite large. This can improve controllability of the back gate electrode BG over charges accumulated in the body B. Therefore, the third embodiment can realize high speed switching of memory cells and increase the signal difference (potential difference) between data "0" and data "1".

Moreover, according to the third embodiment, the cavities 310 serving as through openings are formed in lower portions of the monocrystalline silicon layer 307 serving as the Fin semiconductors, and the back gate electrodes BG penetrating through the respective cavities 310 are formed. Furthermore, each of the back gate electrodes BG is isolated from each of the front gate electrodes FG by the second gate insulating film 314. The front gate electrode FG can be thereby superimposed on the back gate electrode BG while being kept isolated from the back gate electrode BG. Further, the back gate contacts BGC and the front gate contacts FGC are provided on opposite sides of the memory cell array, respectively. As a result, each back gate electrode BG and each front gate electrode FG can apply different voltages to the corresponding body B via the first gate insulating film 311 and the second gate insulating film 314, respectively. The third embodiment can, therefore, exhibit the same advantages as those of the first embodiment.

According to the third embodiment, similarly to the first embodiment, the memory cells can be advantageously downsized since the front gate electrodes FG are superimposed on the back gate electrodes BG, respectively. A size of a cell unit of an FBC memory device according to the third embodiment is quite small, that is, 4 $F^2$ as shown in FIG. 45.

The invention claimed is:

1. A semiconductor memory device comprising:
   a substrate;
   an insulating film provided above the substrate;
   a semiconductor layer provided above the insulating film and extending in a plane which is parallel to a surface of the substrate;
   a first gate dielectric film provided on an inner wall of a opening penetrating through the semiconductor layer;
   a first gate electrode penetrating through the opening and isolated from the semiconductor layer by the first gate dielectric film;
   a second gate dielectric film formed on a side surface and an upper surface of the semiconductor layer located on the first gate electrode; and
   a second gate electrode provided on the side surface and the upper surface of the semiconductor layer via the second gate dielectric film, isolated from the first gate electrode, and superimposed on the first gate electrode.

2. The semiconductor memory device according to claim 1, wherein
   a region of the semiconductor layer right under the second gate electrode is in an electrically floating state, and functions as a floating body into which or from which carriers are accumulated or emitted to store data, and
   the semiconductor memory device further comprises a source layer and a drain layer provided in regions of the semiconductor layer adjacent to the floating body, respectively.

3. The semiconductor memory device according to claim 1, wherein the insulating film is formed into a bird's beak shape below the semiconductor layer.

4. The semiconductor memory device according to claim 1, wherein an extension direction of the first gate electrode and the second gate electrode crosses an extension direction of the semiconductor layer.

5. The semiconductor memory device according to claim 1, wherein the second gate electrode is formed into an Ω shape or a π shape on the side surface and the upper surface of the semiconductor layer via the second gate dielectric film.

6. The semiconductor memory device according to claim 4, wherein
a contact to the first gate electrode is provided on one end of the first gate electrode, and
a contact to the second gate electrode is provided on other end opposite to the one end of the first gate electrode across the semiconductor layer.

7. The semiconductor memory device according to claim 2, further comprising:
a source line connected to the source layer; and
a bit line connected to the drain layer, wherein
the first gate electrode, the second gate electrode, and the source line extend in parallel to one another, and the bit line is approximately orthogonal to the first gate electrode, the second gate electrode, and the source line.

* * * * *